(12) United States Patent
Komurasaki et al.

(10) Patent No.: US 6,472,925 B1
(45) Date of Patent: Oct. 29, 2002

(54) MIXER CIRCUIT WITH NEGATIVE FEEDBACK FILTERING

(75) Inventors: Hiroshi Komurasaki, Tokyo (JP); Hisayasu Satoh, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 855 days.

(21) Appl. No.: 08/788,837

(22) Filed: Jan. 27, 1997

(30) Foreign Application Priority Data

Aug. 9, 1996 (JP) .................................. 8-211147(P)

(51) Int. Cl.[7] .............................. H03B 1/04; H03D 7/14
(52) U.S. Cl. ..................... 327/361; 327/113; 327/551; 455/326
(58) Field of Search ................................ 327/355–359, 327/361, 551, 557, 558, 54, 67, 113, 116, 119, 407, 408, 411; 330/260, 294; 455/313, 326

(56) References Cited

U.S. PATENT DOCUMENTS

| | | | |
|---|---|---|---|
| 3,550,040 A | 12/1970 | Sinusas | |
| 4,598,256 A | * 7/1986 | Kinkel | 330/302 |
| 4,904,952 A | * 2/1990 | Tanimoto | 330/252 |
| 5,157,559 A | * 10/1992 | Gleason et al. | 360/46 |
| 5,355,094 A | * 10/1994 | Soda | 330/260 |
| 5,378,997 A | * 1/1995 | Sawyer | 330/294 |
| 5,379,457 A | * 1/1995 | Nguyen | 327/113 |
| 5,465,072 A | * 11/1995 | Atarodi | 330/254 |
| 5,475,327 A | 12/1995 | Wu et al. | 327/308 |
| 5,563,545 A | * 10/1996 | Scheinberg | 327/389 |
| 5,630,228 A | * 5/1997 | Mittel | 327/359 |

FOREIGN PATENT DOCUMENTS

| | | | |
|---|---|---|---|
| DE | 44 14 943 | 11/1991 | ............ H03D/7/12 |
| DE | 44 10 030 | 1/1995 | ............ H03C/1/42 |
| JP | 54-5644 | 1/1979 | ............ H03F/1/32 |
| JP | 8-4730 | 2/1996 | ............ H03F/1/42 |

* cited by examiner

*Primary Examiner*—Timothy P. Callahan
*Assistant Examiner*—Terry L. Englund
(74) *Attorney, Agent, or Firm*—Burns, Doane, Swecker & Mathis, LLP

(57) ABSTRACT

A mixer circuit having a high conversion gain which is excellent in linearity comprises an amplifier (1A) for amplifying one of two signals to be mixed with each other. The amplifier (1A) comprises a low-pass filter (14) not damping an input voltage (v1) of a frequency (f1) on a negative feedback circuit for its output. Due to the low-pass filter (14), it is possible to reduce harmonics by increasing the feedback amount as the frequency is increased.

36 Claims, 8 Drawing Sheets

MIXER CIRCUIT WITH NEGATIVE FEEDBACK FILTERING

BACKGROUND OF THE INVENTION

1. Field of the Invention

The present invention relates to a mixer circuit for mixing a plurality of input signals with each other, and more particularly, it relates to a mixer circuit having a high conversion gain, which is improved in linearity.

2. Description of the Background Art

FIG. 16 is a circuit diagram showing the structure of a conventional Gilbert cell type mixer circuit. Referring to FIG. 16, reference character 1G denotes a differential amplifier for amplifying an input voltage v1, and reference character 4A denotes a mixer part for mixing an output of the differential amplifier 1G with an input voltage v2. The conventional mixer circuit is formed by the mixer part 4A and the differential amplifier 1G, for outputting first and second output currents i1 and i2 from first and second output terminals 19 and 20 respectively.

The differential amplifier 1G is formed by an NPN bipolar transistor Q27 having a base which is connected to a non-inverting input terminal 150 and a collector which is connected to a first non-inverting input terminal 17 of the mixer part 4A and an emitter, an NPN bipolar transistor Q28 having a base which is connected to an inverting input terminal 151 and a collector which is connected to a first inverting input terminal 18 of the mixer part 4A and an emitter, current sources 152 and 153 for extracting prescribed direct currents IEE from a node which connects the emitters of the transistor Q27 and a resistor 154 and from a node which connects the emitter of the transistor Q28 and resistor 154 respectively, and the resistor 154 connecting the emitters of the transistors Q27 and Q28 with each other.

The mixer part 4A is formed by an NPN bipolar transistor Q3 having a base, a collector and an emitter which are connected to a second non-inverting input terminal 15, the first output terminal 19 and the first non-inverting input terminal 17 respectively, an NPN bipolar transistor Q4 having a base, a collector and an emitter which are connected to a second inverting input terminal 16, the second output terminal 20 and the first non-inverting input terminal 17 respectively, an NPN bipolar transistor Q5 having a base, a collector and an emitter which are connected to the second inverting input terminal 16, the first output terminal 19 and the first inverting input terminal 18 respectively, and an NPN bipolar transistor Q6 having a base, a collector and an emitter which are connected to the second non-inverting input terminal 15, the second output terminal 20 and the first inverting input terminal 18 respectively.

The inputted first input voltage v1 is amplified by an emitter differential pair circuit which is formed by the transistors Q27 and Q28, and appears as a difference between respective collector currents of the transistors Q27 and Q28. The respective collector currents of the transistors Q27 and Q28 define tail currents of an emitter differential pair circuit which is formed by the transistors Q3 and Q4 and that formed by the transistors Q5 and Q6. The second input voltage v2 is amplified by these emitter differential pair circuits formed by the transistors Q3, Q4, Q5 and Q6.

The aforementioned relations are expressed in the following numerical formulas. Ignoring the resistance value of the resistor 154, the respective collector currents ic27 and ic28 of the transistors Q27 and Q28 are expressed in the following numerical formulas 1 and 2:

$$ic27 = \frac{2IEE}{1 + \exp\left[-\frac{v1}{V_T}\right]} \quad (1)$$

$$ic28 = \frac{2IEE}{1 + \exp\left[-\frac{v1}{V_T}\right]} \quad (2)$$

Assuming that ic3, ic4, ic5 and ic6 represent respective collector currents of the transistors Q3 to Q6, these collector currents ic3 to ic6 are expressed in the following numerical formulas 3 to 6:

$$ic3 = \frac{ic27}{1 + \exp\left[-\frac{v2}{V_T}\right]} \quad (3)$$

$$ic4 = \frac{ic27}{1 + \exp\left[\frac{v2}{V_T}\right]} \quad (4)$$

$$ic5 = \frac{ic28}{1 + \exp\left[\frac{v2}{V_T}\right]} \quad (5)$$

$$ic6 = \frac{ic28}{1 + \exp\left[-\frac{v2}{V_T}\right]} \quad (6)$$

From the numerical formulas 1 to 6, the collector currents ic3 to ic6 of the transistors Q3 to Q6 and the first and second input voltages v1 and v2 have relations of the following numerical formulas 7 to 10:

$$ic3 = \frac{2IEE}{\left[1 + \exp\left[-\frac{v1}{V_T}\right]\right]\left[1 + \exp\left[-\frac{v2}{V_T}\right]\right]} \quad (7)$$

$$ic4 = \frac{2IEE}{\left[1 + \exp\left[-\frac{v1}{V_T}\right]\right]\left[1 + \exp\left[\frac{v2}{V_T}\right]\right]} \quad (8)$$

$$ic5 = \frac{2IEE}{\left[1 + \exp\left[\frac{v1}{V_T}\right]\right]\left[1 + \exp\left[\frac{v2}{V_T}\right]\right]} \quad (9)$$

$$ic6 = \frac{2IEE}{\left[1 + \exp\left[\frac{v1}{V_T}\right]\right]\left[1 + \exp\left[-\frac{v2}{V_T}\right]\right]} \quad (10)$$

From the numerical formulas 7 to 10, a differential output current (i1−i2) is given by the following numerical formula 11:

$$i1 - i2 = ic3 + ic5 - (ic6 + ic4) \quad (11)$$

$$= 2IEE\left[\tanh\left[\frac{v1}{2V_T}\right]\right]\left[\tanh\left[\frac{v2}{2V_T}\right]\right]$$

In general, tanhx can be expanded in a series as follows:

$$\tanh x = x - \frac{x^3}{3} \quad (12)$$

If x is sufficiently less than 1 in the numerical formula 11, the numerical formula 12 can be transformed into the following numerical formula 13, and hence the relation between the input voltages v1 and v2 and the output signals i1 and i2 is expressed in the following numerical formula 14:

$$\tanh x \approx x \quad (13)$$

$$i1 - i2 \approx 2IEE \left[ \frac{v1}{2V_T} \right] \left[ \frac{v2}{2V_T} \right] \quad (14)$$

Namely, this mixer circuit is adapted to multiply the first input voltage v1 by the second input voltage v2. If the first and second input voltages v1 and v2 are two signals having different frequencies f1 and f2, the mixer circuit multiplies these two signals by each other, thereby outputting signals having frequency components of the sum |f1+f2| of and the difference |f1−f2| between the frequencies of the two signals.

The emitters of the transistors Q27 and Q28 are connected with each other through the resistor 154, whereby a negative feedback effect results in the emitter differential pair circuit which is formed by the transistors Q27 and Q28. Namely, the conversion gain Gc of the mixer circuit is in inverse proportion to the resistance value of the resistor 154 forming a negative feedback circuit. The following numerical formula 15 expresses the relation between the conversion gain Gc and the resistance value RE of the resistor 154:

$$G_c \propto \frac{1}{RE} \quad (15)$$

In order to increase the gain of the conventional mixer circuit having the aforementioned structure, the resistance value RE of the resistor 154 must be reduced. If the resistance value RE of the resistor 154 is reduced, however, nonlinearity of the circuit is disadvantageously increased to cause excess harmonics or intermodulation distortion.

SUMMARY OF THE INVENTION

According to a first aspect of the present invention, a mixer circuit comprises a mixer part having first and second input terminals and an output terminal for mixing first and second signals which are inputted from the first and second input terminals with each other, and an amplifier having an input terminal for receiving a third signal, an output terminal which is connected to the first input terminal, and a negative feedback circuit having a prescribed pass characteristic for passing the third signal with no filtration for feeding back an output signal, for amplifying the third signal and outputting the same to the mixer part as the first signal.

According to a second aspect of the present invention, the prescribed pass characteristic of the negative feedback circuit is a low-pass characteristic.

According to a third aspect of the present invention, the first input terminal of the mixer part comprises a first inverting input terminal and a first non-inverting input terminal, the second input terminal comprises a second inverting input terminal and a second non-inverting input terminal, the input terminal of the amplifier comprises an inverting input terminal for inputting the third signal and a non-inverting input terminal, and the amplifier is further provided with a first transistor having a control electrode which is connected to the non-inverting input terminal of the amplifier, a first current electrode which is connected to the first non-inverting input terminal, and a second current electrode, a second transistor having a control electrode which is connected to the inverting input terminal of the amplifier, a first current electrode which is connected to the first inverting input terminal, and a second current electrode, a first current source which is connected to the second current electrode of the first transistor for feeding a first direct current, a second current source which is connected to the second current electrode of the second transistor for feeding a second direct current, and a low-pass filter which is connected between the second current electrodes of the first and second transistors.

According to a fourth aspect of the present invention, the first input terminal of the mixer part comprises a first inverting input terminal and a first non-inverting input terminal, the second input terminal comprises a second inverting input terminal and a second non-inverting input terminal, the input terminal of the amplifier comprises an inverting input terminal for inputting the third signal and a non-inverting input terminal, and the amplifier is further provided with a first transistor having a control electrode which is connected to the non-inverting input terminal of the amplifier, a first current electrode which is connected to the first non-inverting input terminal, and a second current electrode, a second transistor having a control electrode which is connected to the inverting input terminal of the amplifier, a first current electrode which is connected to the first inverting input terminal, and a second current electrode, a first low-pass filter having a first end which is connected to the second current electrode of the first transistor, and a second end, a second low-pass filter having a first end which is connected to the second current electrode of the second transistor, and a second end which is connected to the second end of the first low-pass filter, and a current source which is connected to the second end of the first low-pass filter for feeding a prescribed direct current.

According to a fifth aspect of the present invention, the prescribed pass characteristic of the negative feedback circuit is a bandpass characteristic.

According to a sixth aspect of the present invention, the first input terminal of the mixer circuit comprises a first inverting input terminal and a first non-inverting input terminal, the second input terminal comprises a second inverting input terminal and a second non-inverting input terminal, the input terminal of the amplifier comprises an inverting input terminal for inputting the third signal and a non-inverting input terminal, and the amplifier is further provided with a first transistor having a control electrode which is connected to the non-inverting input terminal of the amplifier, a first current electrode which is connected to the first non-inverting input terminal, and a second current electrode, a second transistor having a control electrode which is connected to the inverting input terminal of the amplifier, a first current electrode which is connected to the first inverting input terminal, and a second current electrode, a first bandpass filter having a first end which is connected to the second current electrode of the first transistor, and a second end, a second bandpass filter having a first end which is connected to the second current electrode of the second transistor, and a second end which is connected to the second end of the first bandpass filter, and a current source which is connected to the second end of the first bandpass filter for feeding a prescribed direct current.

According to a seventh aspect of the present invention, the first input terminal of the mixer part comprises a first inverting input terminal and a first non-inverting input terminal, the second input terminal comprises a second inverting input terminal and a second non-inverting input terminal, the input terminal of the amplifier comprises an inverting input terminal for inputting the third signal and a non-inverting input terminal, and the amplifier is further provided with a first transistor having a control electrode which is connected to the non-inverting input terminal of the amplifier, a first current electrode which is connected to the first inverting input terminal, and a second current electrode, a second transistor having a control electrode which is connected to the inverting input terminal of the amplifier, a first current electrode which is connected to the first non-inverting input terminal, and a second current electrode, a first current source which is connected to the second current electrode of the first transistor for feeding a first direct current, a second current source which is connected to the second current electrode of the second transistor for feeding a second direct current, and a bandpass filter which is connected between the second current electrodes of the first and second transistors.

According to an eighth aspect of the present invention, the negative feedback circuit comprises an inductor.

According to a ninth aspect of the present invention, a mixer circuit comprises a mixer part having first and second input terminals and an output terminal, as well as a negative feedback circuit having a prescribed pass characteristic for passing signals which are inputted from the first and second input terminals with no filtration for negatively feeding back processing paths for the signals which are inputted from the first and second input terminals, for mixing first and second signals inputted from the first and second input terminals with each other, and an amplifier having an input terminal for receiving a third signal and an output terminal which is connected to the first input terminal, for amplifying the third signal and outputting the same to the mixer part as the first signal.

According to a tenth aspect of the present invention, the prescribed pass characteristic of the negative feedback circuit is a low-pass characteristic.

According to an eleventh aspect of the present invention, the first input terminal of the mixer part comprises a first inverting input terminal and a first non-inverting input terminal, the second input terminal comprises a second inverting input terminal and a second non-inverting input terminal, the output terminal of the mixer part comprises first and second output terminals, and the mixer part is further provided with a first transistor having a control electrode which is connected to the second non-inverting input terminal, a first current electrode which is connected to the first output terminal, and a second current electrode, a second transistor having a control electrode which is connected to the second inverting input terminal, a first current electrode which is connected to the second output terminal, and a second current electrode, a first low-pass filter having a first end which is connected to the second current electrode of the first transistor, and a second end which is connected to the first inverting input terminal, a second low-pass filter having a first end which is connected to the second current electrode of the second transistor, and a second end which is connected to the first inverting input terminal, a third transistor having a control electrode which is connected to the second inverting input terminal, a first current electrode which is connected to the first output terminal, and a second current electrode, a fourth transistor having a control electrode which is connected to the second non-inverting input terminal, a first current electrode which is connected to the second output terminal, and a second current electrode, a third low-pass filter having a first end which is connected to the second current electrode of the third transistor, and a second end which is connected to the first non-inverting input terminal, and a fourth low-pass filter having a first end which is connected to the second current electrode of the fourth transistor, and a second end which is connected to the first non-inverting input terminal.

According to a twelfth aspect of the present invention, the prescribed pass characteristic of the negative feedback circuit is a bandpass characteristic.

According to a thirteenth aspect of the present invention, the first input terminal of the mixer part comprises a first inverting input terminal and a first non-inverting input terminal, the second input terminal comprises a second inverting input terminal and a second non-inverting input terminal, the output terminal of the mixer part comprises first and second output terminals, and the mixer part is further provided with a first transistor having a control electrode which is connected to the second non-inverting input terminal, a first current electrode which is connected to the first output terminal, and a second current electrode, a second transistor having a control electrode which is connected to the second inverting input terminal, a first current electrode which is connected to the second output terminal, and a second current electrode, a first bandpass filter having a first end which is connected to the second current electrode of the first transistor, and a second end which is connected to the first inverting input terminal, a second bandpass filter having a first end which is connected to the second current electrode of the second transistor, and a second end which is connected to the first inverting input terminal, a third transistor having a control electrode which is connected to the second inverting input terminal, a first current electrode which is connected to the first output terminal, and a second current electrode, a fourth transistor having a control electrode which is connected to the second non-inverting input terminal, a first current electrode which is connected to the second output terminal, and a second current electrode, a third bandpass filter having a first end which is connected to the second current electrode of the third transistor, and a second end which is connected to the first non-inverting input terminal, and a fourth bandpass filter having a first end which is connected to the second current electrode of the fourth transistor, and a second end which is connected to the first non-inverting input terminal.

According to a fourteenth aspect of the present invention, the low-pass filter comprises a secondary or higher order low-pass filter.

According to a fifteenth aspect of the present invention, the low-pass filter comprises a series body comprising an inductor and a resistor which are connected between the second current electrodes of the first and second transistors.

According to a sixteenth aspect of the present invention, the bandpass filter comprises a secondary or higher order bandpass filter.

In the mixer circuit according to the first aspect of the present invention, as hereinabove described, the negative feedback circuit of the amplifier has the prescribed pass characteristic for passing the third signal with no filtration, whereby a high conversion gain is attained while an unnecessary frequency component is reduced in amplification so that intermodulation distortion having a frequency of the sum of or the difference between the two signals inputted from the first and second input terminals, for example, is reduced and distortion of the output of the mixer circuit can be effectively reduced.

In the mixer circuit according to the second aspect of the present invention, the negative feedback circuit of the amplifier has the low-pass characteristic, whereby a harmonic component can be reduced and distortion of the output of the mixer circuit can be effectively suppressed.

In the mixer circuit according to the third aspect of the present invention, the feedback amount of the differential pair circuit which is formed by the first and second transistors can be increased by the low-pass filter which is connected between the second current electrodes of the first and second transistors forming the differential pair circuit as the frequency is increased, whereby a mixer circuit having a high conversion gain and small output distortion can be effectively obtained in a simple structure.

In the mixer circuit according to the fourth aspect of the present invention, the negative feedback of the differential pair circuit which is formed by the first and second transistors can be decided by the first and second low-pass filters which are serially connected between the second current electrodes of the first and second transistors forming the differential pair circuit, whereby a mixer circuit having a high conversion gain and small output distortion can be effectively obtained in a simple structure.

In the mixer circuit according to the fifth aspect of the present invention, the negative feedback circuit of the amplifier has the bandpass characteristic, whereby unnecessary frequency components other than the frequencies of the input signals can be reduced and output distortion of the mixer circuit can be effectively reduced.

In the mixer circuit according to the sixth aspect of the present invention, the feedback amount of the differential pair circuit which is formed by the first and second transistors can be increased by the first and second bandpass filters which are connected between the second current electrodes of the first and second transistors forming the differential pair circuit as the frequency component is unnecessary, whereby a mixer circuit having a high conversion gain and small output distortion can be effectively obtained in a simple structure.

In the mixer circuit according to the seventh aspect of the present invention, the feedback amount of the differential pair circuit which is formed by the first and second transistors can be increased by the bandpass filter which is connected between the second current electrodes of the first and second transistors forming the differential pair circuit as the frequency component is unnecessary, whereby a mixer circuit having a high conversion gain and small output distortion can be effectively obtained in a simple structure.

In the mixer circuit according to the eighth aspect of the present invention, a filter having a prescribed pass characteristic can be brought into a simple structure, whereby an excellent characteristic can be easily attained.

In the mixer circuit according to the ninth aspect of the present invention, the mixer part has the prescribed pass characteristic for passing the first signal with no filtration with respect to the signal inputted from the first input terminal, whereby a high conversion gain is attained while an unnecessary frequency component is reduced in amplification so that intermodulation distortion having a frequency of the sum of or the difference between the two signals inputted from the first and second input terminals, for example, is reduced and distortion of the output of the mixer circuit can be effectively reduced.

In the mixer circuit according to the tenth aspect of the present invention, the negative feedback circuit in the mixer part has the low-pass characteristic, whereby a harmonic component can be reduced in mixing of the signals and distortion of the output of the mixer circuit can be effectively reduced.

In the mixer circuit according to the eleventh aspect of the present invention, the negative feedback of the differential pair circuit which is formed by the first and second transistors can be decided by the first and second low-pass filters which are serially connected between the second current electrodes of the first and second transistors and the negative feedback of the differential pair circuit which is formed by the third and fourth transistors can be decided by the third and fourth low-pass filters which are serially connected between the second current electrodes of the third and fourth transistors, whereby a mixer circuit having a high conversion gain and small output distortion can be effectively obtained in a simple structure.

In the mixer circuit according to the twelfth aspect of the present invention, the negative feedback circuit of the mixer part has the bandpass characteristic, whereby unnecessary frequency components other than the frequencies of the input signals can be reduced and output distortion of the mixer circuit can be reduced.

In the mixer circuit according to the thirteenth aspect of the present invention, the negative feedback of the differential pair circuit which is formed by the first and second transistors can be decided by the first and second bandpass filters which are serially connected between the second current electrodes of the first and second transistors and the negative feedback of the differential pair circuit which is formed by the third and fourth transistors can be decided by the third and fourth bandpass filters which are serially connected between the second current electrodes of the third and fourth transistors, whereby a mixer circuit having a high conversion gain and small output distortion can be effectively obtained in a simple structure.

In the mixer circuit according to the fourteenth aspect of the present invention, a higher order low-pass filter has higher ability for eliminating high frequencies, whereby the performance for improving output nonlinearity can be improved as compared with the case of employing a primary order low-pass filter.

In the mixer circuit according to the fifteenth aspect of the present invention, the inductor and the resistor are connected in series with each other, whereby the occupied area can be reduced and a mixer circuit suitable for an integrated circuit can be effectively obtained.

In the mixer circuit according to the sixteenth aspect of the present invention, a higher bandpass filter has higher ability for eliminating unnecessary frequency components, whereby output distortion can be reduced as compared with the case of employing a primary low-pass filter.

Accordingly, an object of the present invention is to obtain a mixer circuit having a high conversion gain, which is excellent in linearity.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
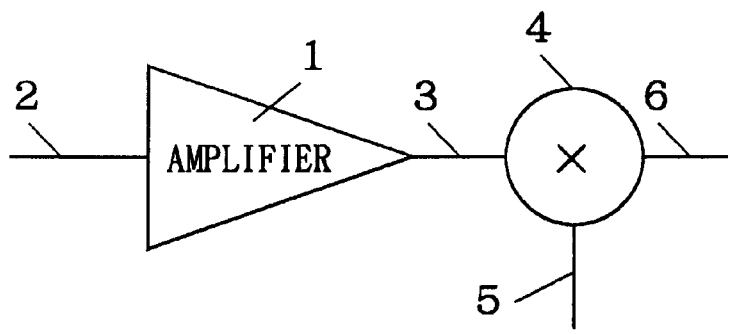
FIG. 1 is a block diagram for illustrating the structure of a mixer circuit according to each embodiment of the present invention.

A mixer circuit according to the present invention is now described with reference to FIGS. 1 and 2. Referring to FIG. 1, reference numeral 1 denotes an amplifier having such a characteristic that the gain with respect to a frequency exceeding a prescribed frequency which is higher than a frequency f1 of an input voltage v1 is reduced for amplifying a signal inputted from an input terminal 2, and reference numeral 4 denotes a mixer part for mixing a signal which is supplied from an output terminal 3 of the amplifier 1 with a signal inputted from an input terminal 5 and outputting the mixed signal from an output terminal 6. First and second input voltages v1 and v2 are signals having different frequencies f1 and f2 respectively.

According to an embodiment 1, the amplifier 1 has such a characteristic that the gain with respect to the frequency exceeding the prescribed frequency which is higher than the frequency f1 of the input voltage v1 is reduced, whereby the gain with respect to harmonics of an input signal inputted in the amplifier 1 is smaller than that with respect to a desired signal, and harmonics are hardly caused in the amplifier 1. Thus, a harmonic component of a signal which is amplified by the amplifier 1 is reduced. Due to such reduction of the harmonic component in the amplifier 1, intermodulation distortion or the like can be reduced, whereby the mixer circuit according to the embodiment 1 can obtain an output of lower distortion than that in a conventional mixer circuit.

Assuming that f1 and f2 represent the frequencies of the input voltages v1 and v2 respectively and f1' represents the frequency of a jamming wave for the input voltage v1, tertiary intermodulation distortion (IM3) caused in the mixer circuit has frequencies of {(2f1−f1')−f2} and {(2f1'−f1)−f2}, while the frequencies are (2f1−f1') and (2f'−f) in case of the amplifier 1. Namely, intermodulation distortion is a component which is caused when two signals (one is a jamming wave) are inputted in a single input.

Figure 2:
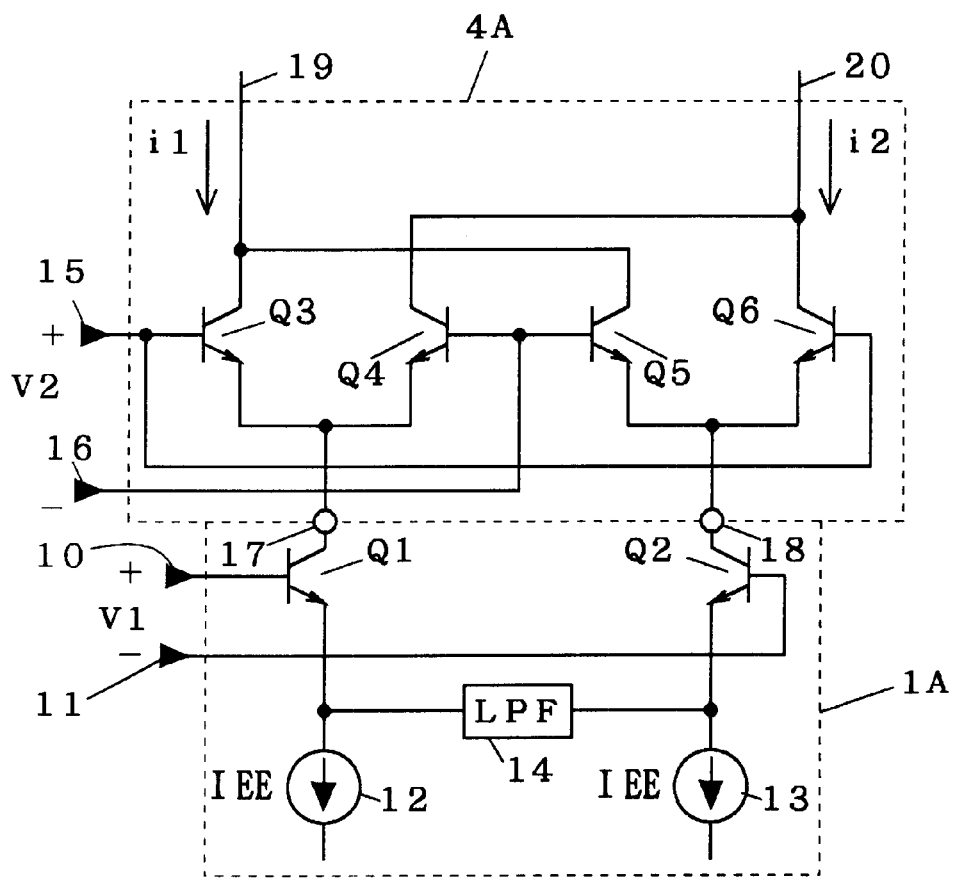
FIG. 2 is a circuit diagram showing the structure of a mixer circuit according to an embodiment 1 of the present invention.

FIG. 2 is a circuit diagram showing the structure of the mixer circuit according to the embodiment 1 of the present invention. Referring to FIG. 2, reference character 1A denotes a differential amplifier having such a characteristic that the gain is reduced as the frequency is increased for amplifying the input voltage v1, and reference character 4A denotes a mixer part for mixing an output of the differential amplifier 1A with the input voltage v2. The mixer circuit according to the embodiment 1 is formed by the mixer part 4A and the differential amplifier 1A, for outputting first and second output currents i1 and i2.

The differential amplifier 1A is formed by an NPN bipolar transistor Q1 having a base which is connected to a non-inverting input terminal 10 of the differential amplifier 1A and a collector which is connected to a first non-inverting input terminal 17 of the mixer part 4A and an emitter, an NPN bipolar transistor Q2 having a base which is connected to an inverting input terminal 11 of the differential amplifier 1A and a collector which is connected to a first inverting input terminal 18 of the mixer part 4A and an emitter, current sources 12 and 13 for extracting prescribed direct currents from a node which connects the emitter of the transistor Q1 and a low-pass filter 14 and from a node which connects the emitter of the transistor Q2 and low-pass filter 14 respectively, and the low-pass filter 14 connecting the emitters of the transistors Q1 and Q2 with each other.

This low-pass filter 14 has a frequency characteristic of not damping the frequency f1 of the first input voltage v1 but cutting a prescribed frequency which is higher than the frequencies f1 and f2.

The mixer part 4A is formed by an NPN bipolar transistor Q3 having a base, a collector and an emitter which are connected to a second non-inverting input terminal 15, a first output terminal 19 and the first non-inverting input terminal 17 respectively, an NPN bipolar transistor Q4 having a base, a collector and an emitter which are connected to a second inverting input terminal 16, a second output terminal 20 and the first non-inverting input terminal 17 respectively, an NPN bipolar transistor Q5 having a base, a collector and an emitter which are connected to the second inverting input terminal 16, the first output terminal 19 and the first inverting input terminal 18 respectively, and an NPN bipolar transistor Q6 having a base, a collector and an emitter which are connected to the second non-inverting input terminal 15, the second output terminal 20 and the first inverting input terminal 18 respectively.

The inputted first input voltage v1 is amplified by an emitter differential pair circuit which is formed by the transistors Q1 and Q2, to appear as the difference between respective collector currents of the transistors Q1 and Q2. The respective collector currents of the transistors Q1 and Q2 define tail currents of an emitter differential pair circuit which is formed by the transistors Q3 and Q4 and that formed by the transistors Q5 and Q6. The second input voltage v2 is amplified by the emitter differential pair circuit which is formed by the transistors Q3 and Q4 and that formed by the transistors Q5 and Q6.

The emitters of the transistors Q1 and Q2 are connected with each other through the low-pass filter 14, whereby a negative feedback effect results in the emitter differential pair circuit which is formed by the transistors Q1 and Q2 through the low-pass filter 14. Further, a negative feedback circuit provided between the emitters of the transistors Q1 and Q2 is formed by the low-pass filter 14, whereby the feedback amount for a signal having a frequency exceeding the cut-off frequency of the low-pass filter 14 is increased as its frequency is increased. Namely, the gain of the emitter differential pair circuit which is formed by the transistors Q1 and Q2 with respect to harmonics generated in this emitter differential pair circuit is smaller than that with respect to a desired signal, whereby harmonics are hardly generated in the emitter differential pair circuit formed by the transistors Q1 and Q2. Therefore, a harmonic component of the signal amplified by the emitter differential pair circuit which is formed by the transistors Q1 and Q2 is reduced, whereby nonlinearity of the circuit is improved in the mixer circuit according to the embodiment 1, whereby an output of lower distortion than the conventional mixer circuit shown in FIG. 16 can be obtained.

Embodiment 2

Figure 3:
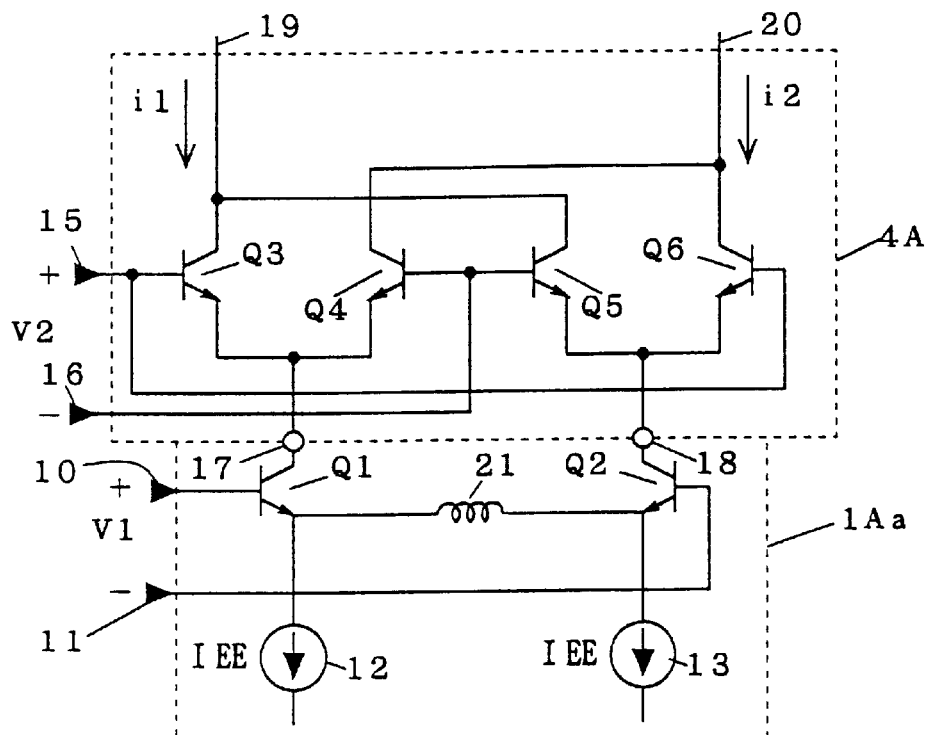
FIG. 3 is a circuit diagram showing the structure of a mixer circuit according to an embodiment 2 of the present invention.

FIG. 3 is a circuit diagram showing the structure of a mixer circuit according to an embodiment 2 of the present invention. Referring to FIG. 3, reference character 1Aa denotes a differential amplifier having such a characteristic that the gain with respect to a frequency exceeding a prescribed frequency which is higher than a frequency f1 of an input voltage v1 is reduced for amplifying the input voltage v1, and reference character 4A denotes a mixer part for mixing an output of the differential amplifier 1Aa with an input voltage v2. The mixer part 4A shown in FIG. 3 corresponds to and has the same structure as the mixer part 4A of FIG. 2. While an inductor 21 is employed for the differential amplifier 1Aa shown in FIG. 3 in place of the low-pass filter 14 of the differential amplifier 1A shown in FIG. 2, the remaining parts of the differential amplifiers 1Aa and 1A are identical in structure to each other.

The inductor 21 serves as a low-pass filter, whereby a harmonic component of a signal amplified by an emitter differential pair circuit which is formed by transistors Q1 and Q2 is reduced and nonlinearity is improved so that an output of low distortion can be obtained, similarly to the mixer circuit shown in FIG. 2. The structure of the low-pass filter can be simplified by employing the inductor 21, whereby excellent characteristics can be readily obtained. This effect is common to circuits comprising inductors which are serially connected between emitters of transistors Q1 and Q2.

Embodiment 3

Figure 4:
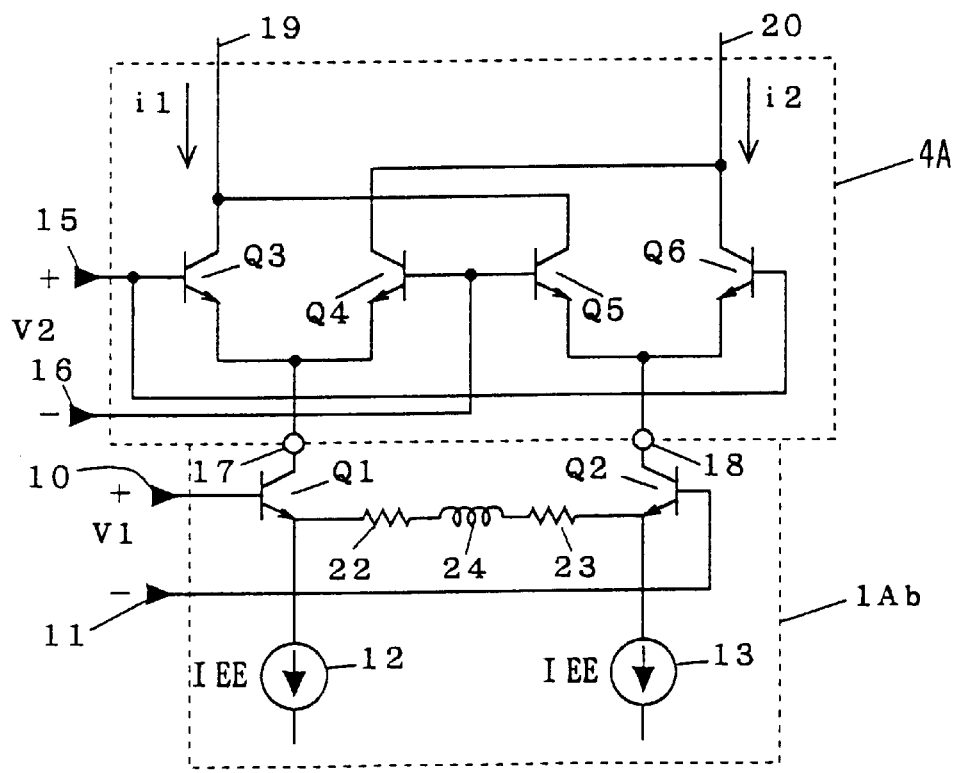
FIG. 4 is a circuit diagram showing the structure of a mixer circuit according to an embodiment 3 of the present invention.

FIG. 4 is a circuit diagram showing the structure of a mixer circuit according to an embodiment 3 of the present invention. Referring to FIG. 4, reference character 1Ab denotes a differential amplifier having such a characteristic that the gain with respect to a frequency exceeding a prescribed frequency which is higher than a frequency f1 of an input voltage v1 is reduced for amplifying the input voltage v1, and referene character 4A denotes a mixer part for mixing an output of the differential amplifier 1Ab with an input voltage v2. The mixer part 4A shown in FIG. 4 corresponds to and has the same structure as the mixer part 4A of FIG. 2. While resistors 22 and 23 and an inductor 24 are employed for the differential amplifier 1Ab shown in FIG. 4 in place of the low-pass filter 14 of the differential amplifier 1A shown in FIG. 2, the remaining parts of the differential amplifiers 1Ab and 1A are identical in structure to each other.

The mixer circuit shown in FIG. 4 is different from that of FIG. 3 in a point that the resistors 22 and 23 are connected in series with the inductor 24 which is connected between emitters of transistors Q1 and Q2 in FIG. 4, while only the inductor 21 is connected between the transistors Q1 and Q2 in FIG. 3. In a semiconductor integrated circuit, it is so difficult to implement an inductor of high inductivity that it may be impossible to sufficiently reduce harmonics through an inductor alone. Therefore, the harmonics are further reduced by inserting the resistors 22 and 23. Due to such insertion of the resistors 22 and 23, the required inductance of the inductor 24 can be reduced, whereby the ratio of the area of the inductor 24 occupying the semiconductor integrated circuit can be reduced so that the occupied area of the low-pass filter can be reduced.

Embodiment 4

Figure 5:
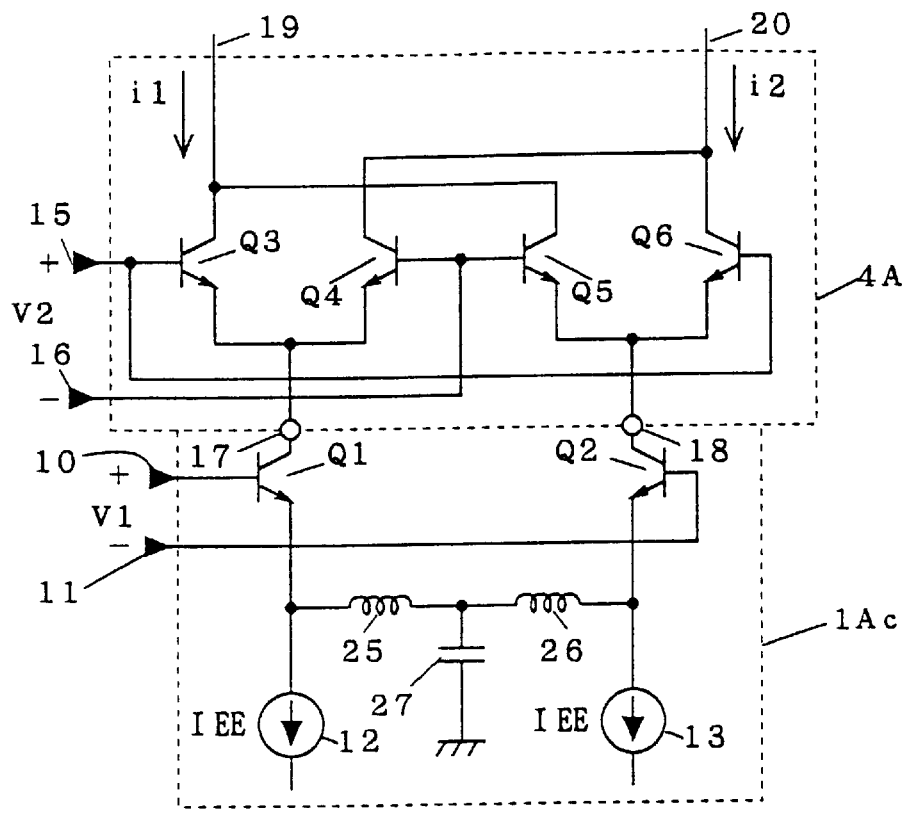
FIG. 5 is a circuit diagram showing the structure of a mixer circuit according to an embodiment 4 of the present invention.

FIG. 5 is a circuit diagram showing the structure of a mixer circuit according to an embodiment 4 of the present invention. Referring to FIG. 5, reference character 1Ac denotes a differential amplifier having such a characteristic that the gain with respect to a frequency exceeding a prescribed frequency which is higher than a frequency f1 of an input voltage v1 is reduced for amplifying the input voltage v1, and reference character 4A denotes a mixer part for mixing an output of the differential amplifier 1Ac with an input voltage v2. The mixer part 4A shown in FIG. 5 corresponds to and has the same structure as the mixer part 4A of FIG. 2. While first and second inductors 25 and 26 and a capacitive element 27 are employed for the differential amplifier 1Ac shown in FIG. 5 in place of the low-pass filter 14 of the differential amplifier 1A shown in FIG. 2, the remaining parts of the differential amplifiers 1Ac and 1A are identical in structure to each other. The inductors 25 and 26 are serially connected between emitters of transistors Q1 and Q2, while the capacitive element 27 is connected across a node between the inductors 25 and 26 and a ground potential point.

The emitters of the transistors Q1 and Q2 are connected with each other through a high order low-pass filter which is formed by the two inductors 25 and 26 and the capacitive element 27, whereby a negative feedback effect results in an emitter differential pair circuit which is formed by the transistors Q1 and Q2. Since the elements serially connected between the emitters of the transistors Q1 and Q2 are the inductors 25 and 26, the feedback amount is increased as the frequency of a signal is increased. However, a filter which is formed by the inductors 25 and 26 and the capacitive element 27 exhibits higher filter characteristics, whereby the mixer circuit according to the embodiment 4 can eliminate more harmonics as compared with that according to the embodiment 2 or 3. Namely, the gain of the emitter differential pair circuit which is formed by the transistors Q1 and Q2 with respect to harmonics generated in the emitter differential pair circuit is smaller than that with respect to a desired signal, whereby harmonics are hardly generated in the emitter differential pair circuit formed by the transistors Q1 and Q2 shown in FIG. 5. Therefore, a harmonic component of the signal amplified by the differential amplifier 1Ac is reduced, whereby an output of lower distortion than the conventional mixer circuit can be obtained. While the low-pass filter according to the embodiment 4 is a tertiary low-pass filter, the effect of eliminating harmonics is improved when a high order filter structure is employed. It is possible to reduce intermodulation distortion appearing in an output of the mixer circuit by reducing the harmonic component of an output signal from the differential amplifier 1Ac.

Embodiment 5

Figure 6:
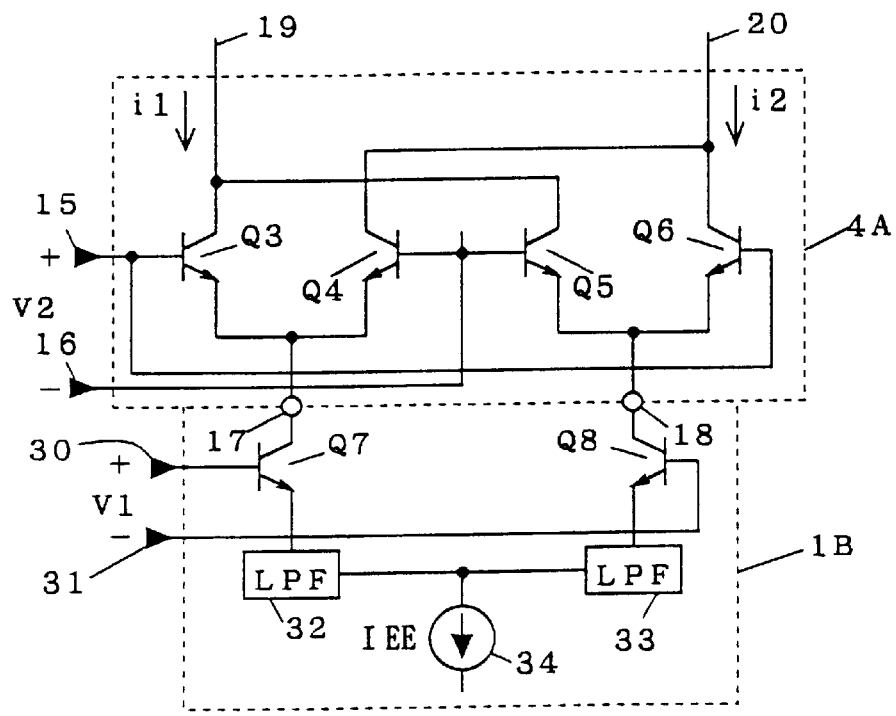
FIG. 6 is a circuit diagram showing the structure of a mixer circuit according to an embodiment 5 of the present invention.

FIG. 6 is a circuit diagram showing the structure of a mixer circuit according to an embodiment 5 of the present invention. Referring to FIG. 6, reference character 1B denotes a differential amplifier having such a characteristic that the gain with respect to a frequency exceeding a prescribed frequency which is higher than a frequency f1 of an input voltage v1 is reduced for amplifying the input voltage v1, and reference character 4A denotes a mixer part for mixing an output of the differential amplifier 1B with an input voltage v2. The mixer circuit according to the embodiment 5 is formed by the mixer part 4A and the differential amplifier 1B, and outputs first and second output currents i1 and i2 from first and second output terminals respectively.

The differential amplifier 1B is formed by an NPN bipolar transistor Q7 having a base which is connected to a non-inverting input terminal 30 and a collector which is connected to a first non-inverting input terminal 17 of the mixer part 4A and an emitter, an NPN bipolar transistor Q8 having a base which is connected to an inverting input terminal 31 and a collector which is connected to a first inverting input terminal 18 of the mixer part 4A and an emitter, low-pass filters 32 and 33 which are serially connected between the emitters of the transistors Q7 and Q8, and a current source 34 for extracting a prescribed direct current IEE from a node between the low-pass filters 32 and 33.

The low-pass filters 32 and 33 do not damp the frequency f1 of the first input voltage v1, and have the same frequency characteristics.

The mixer part 4A shown in FIG. 6 corresponds to and has the same structure as the mixer part 4A of FIG. 2.

The emitters of the transistors Q7 and Q8 are connected to the current source 34 through the low-pass filters 32 and 33, whereby a negative feedback effect results in an emitter differential pair circuit which is formed by the transistors Q7 and Q8. Since the circuits connecting the emitters of the transistors Q7 and Q8 with each other are the low-pass filters 32 and 33, the feedback amount for a signal having a frequency exceeding the cut-off frequency of the low-pass filters 32 and 33 is increased as the frequency is increased. Namely, the gain of the emitter differential pair circuit, which is formed by the transistors Q7 and Q8, with respect to harmonics generated in this emitter differential pair circuit is smaller than that with respect to a desired signal, whereby nonlinearity is improved similarly to the embodiment 1, so that an output of lower distortion than the conventional mixer circuit can be obtained.

A negative feedback circuit such as a circuit consisting of the inductor 21 of the embodiment 2, the resistors 22 and 23 and the inductor 24 of the embodiment 3 or the inductors 25 and 26 and the capacitive element 27 of the embodiment 4 may alternatively be inserted in place of the low-pass filters 32 and 33, to attain an effect similar to those of the aforementioned embodiments.

Embodiment 6

Figure 7:
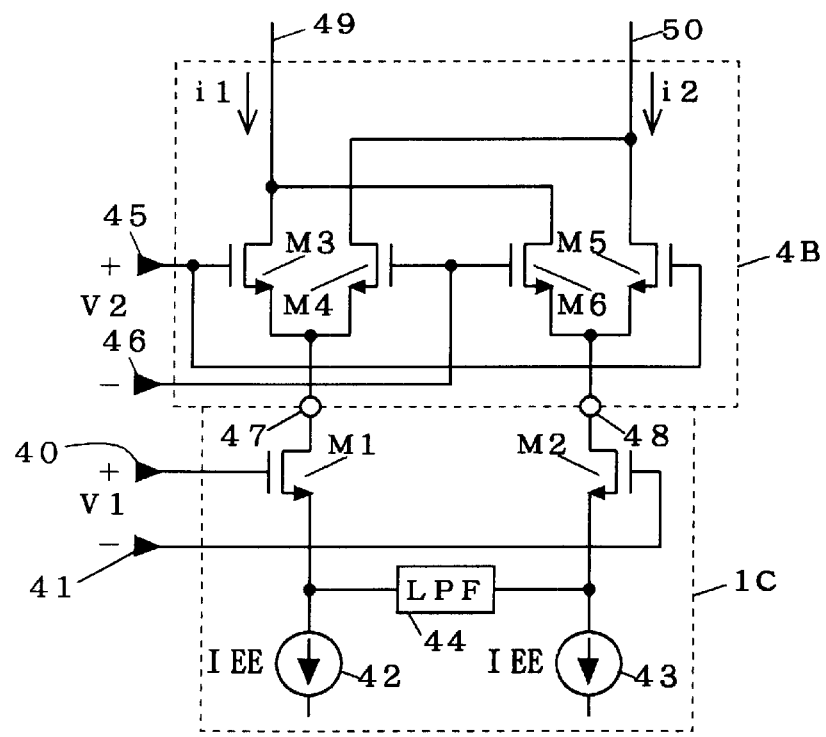
FIG. 7 is a circuit diagram showing the structure of a mixer circuit according to an embodiment 6 of the present invention.

FIG. 7 is a circuit diagram showing the structure of a mixer circuit according to an embodiment 6 of the present invention. Referring to FIG. 7, reference character 1C denotes a differential amplifier having such a characteristic that the gain with respect to a frequency exceeding a prescribed frequency which is higher than a frequency f1 of an input voltage v1 is reduced for amplifying the input voltage v1, and reference character 4B denotes a mixer part for mixing an output of the differential amplifier 1C with an input voltage v2. The mixer circuit shown in FIG. 7 is different from that shown in FIG. 2 in a point that MOSFETs M1~M6 are employed for forming the circuit of FIG. 7, while bipolar transistors are employed for forming the mixer circuit of FIG. 2. The degree of integration of the circuit is further improved by employing the MOSFETs M1~M6. In the mixer circuit of the present invention, the bipolar transistors can be replaced with MOSFETs also in the remaining embodiments.

Embodiment 7

In an embodiment 7, the negative feedback circuit in the amplifier 1 shown in FIG. 1 is provided with a bandpass characteristic. The negative feedback circuit of the amplifier 1 has the characteristic of cutting frequency components other than those around the frequency of the signal inputted from the input terminal 2, whereby the gain with respect to the frequency band other than that around the frequency of the input signal in the amplifier 1 is reduced. Therefore, unnecessary frequency components other than a desired frequency component around the frequency of the input signal are hardly generated in the amplifier 1. Such unnecessary frequency components include intermodulation distortion resulting from the frequency of the sum of or the difference between the frequency f1 of the input voltage v1 and the frequency f1' of the jamming wave inputted from the input terminal 2, for example. In other words, the amplifier 1 is so formed as to have a frequency characteristic capable of damping such unnecessary frequency components. The unnecessary frequency components are reduced from the signal amplified by the amplifier 1, whereby an output of lower distortion can be obtained in the mixer circuit as compared with the case of eliminating only high frequencies.

Figure 8:
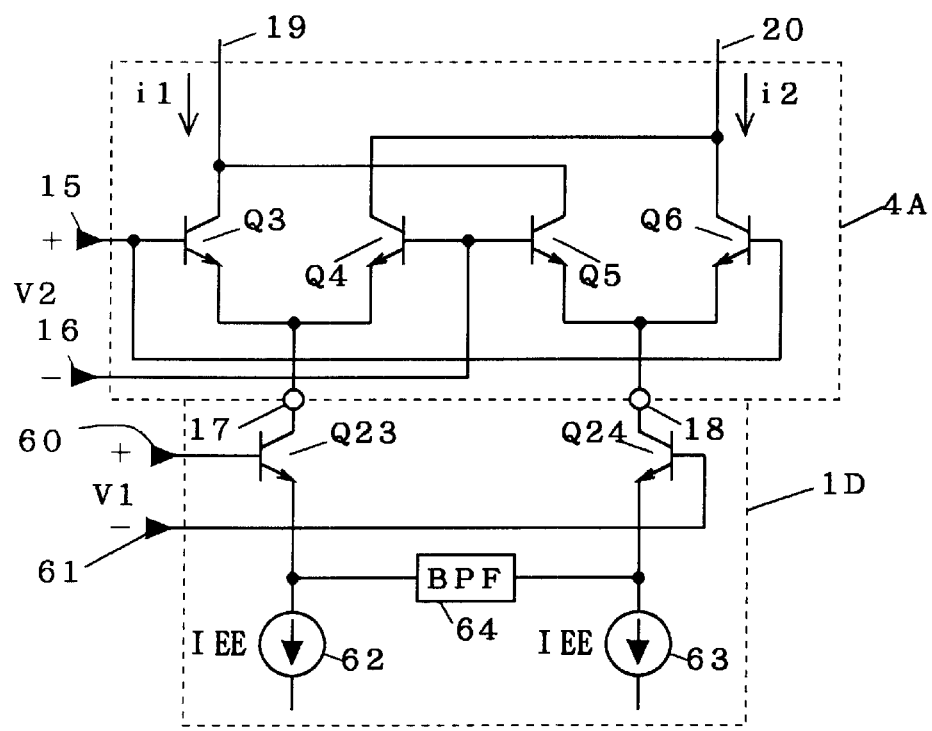
FIG. 8 is a circuit diagram showing the structure of a mixer circuit according to an embodiment 7 of the present invention.

FIG. 8 is a circuit diagram showing the structure of the mixer circuit according to the embodiment 7 of the present invention. Referring to FIG. 8, reference character 1D denotes a differential amplifier having such a characteristic that the gain with respect to a frequency around a frequency f1 of an input voltage v1 is reduced for amplifying the input voltage v1, and reference character 4A denotes a mixer part for mixing an output of the differential amplifier 1D with an input voltage v2. The mixer circuit according to the embodiment 7 is formed by the mixer part 4A and the differential amplifier 1D, and outputs first and second output currents i1 and i2 from first and second output terminals respectively.

The differential amplifier 1D is formed by an NPN bipolar transistor Q23 having a base which is connected to a non-inverting input terminal 60 and a collector which is connected to a first non-inverting input terminal 17 of the mixer part 4A and an emitter, an NPN bipolar transistor Q24 having a base which is connected to an inverting input terminal 61 and a collector which is connected to a first inverting input terminal 18 of the mixer part 4A and an emitter, current sources 62 and 63 for extracting prescribed direct currents IEE from nodes between the emitters of the transistors Q23 and Q24 and a bandpass filter 64 respectively, and the bandpass filter 64 connecting the emitters of the transistors Q23 and Q24 with each other.

The bandpass filter 64 has a frequency characteristic for passing signals of a frequency band around frequencies f1 and f2 of the input voltages v1 and v2 while not damping the signal of the frequency f1.

The mixer part 4A shown in FIG. 8 corresponds to and has the same structure as the mixer part 4A of FIG. 2.

The emitters of the transistors Q23 and Q24 are connected with each other through the bandpass filter 64, whereby a negative feedback effect results in an emitter differential pair circuit which is formed by the transistors Q23 and Q24. Further, the bandpass filter 64 is connected between the emitters of the transistors Q23 and Q24, whereby the feedback amount is increased with respect to a signal having a frequency other than the pass frequency of the bandpass filter 64. Namely, the gain of the emitter differential pair circuit, which is formed by the transistors Q23 and Q24, with respect to unnecessary frequency components generated in the emitter differential pair circuit is smaller than that with respect to a desired signal, whereby unnecessary frequency components are hardly generated in the emitter differential pair circuit formed by the transistors Q23 and Q24. Therefore, unnecessary frequency components are reduced in the signal amplified in the differential amplifier 1D comprising the transistors Q23 and Q24, whereby an output of lower distortion than the conventional mixer circuit can be obtained.

Embodiment 8

Figure 9:
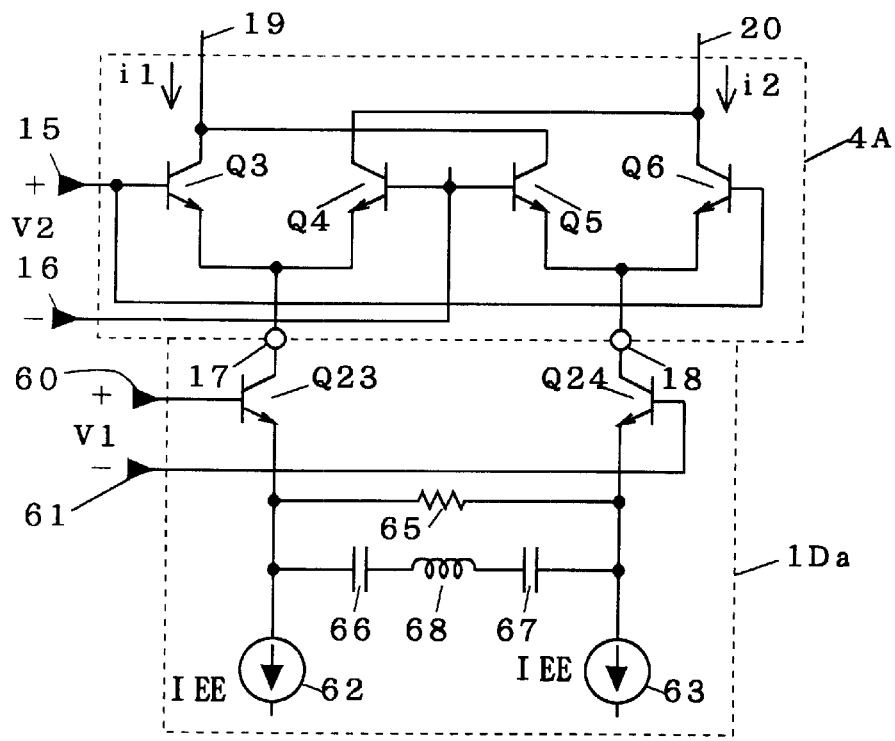
FIG. 9 is a circuit diagram showing the structure of a mixer circuit according. to an embodiment 8 of the present invention.

FIG. 9 is a circuit diagram showing the structure of a mixer circuit according to an embodiment 8 of the present invention. Referring to FIG. 9, reference character 1Da denotes a differential amplifier having such a characteristic that the gain with respect to a frequency other than that around a frequency f1 of an input voltage v1 is reduced for amplifying the input voltage v1, and reference character 4A denotes a mixer part for mixing an output of the differential amplifier 1Da with an input voltage v2. The mixer part 4A shown in FIG. 9 corresponds to and has the same structure as the mixer part 4A of FIG. 8. While a resistor 65, capacitive elements 66 and 67 and an inductor 68 are employed in the differential amplifier 1Da shown in FIG. 9 in place of the bandpass filter 64 of the differential amplifier 1D shown in FIG. 8, the remaining parts of the differential amplifiers 1Da and 1D are identical in structure to each other.

The resistor 65 is connected between emitters of transistors Q23 and Q24. The capacitive element 66 has a first electrode which is connected to the emitter of the transistor Q23, and a second electrode. The inductor 68 has a first end which is connected to the second electrode of the capacitive element 66, and a second end. The capacitive element 67 has first and second electrodes which are connected to the emitter of the transistor Q24 and the second end of the inductor 68 respectively.

Assuming that the first input voltage v1 is a signal of the frequency f1, the resistance value RE of the resistor 65, the inductance LE of the inductor 68 and the capacitance values CE of the capacitive elements 66 and 67 are rendered to satisfy the following relation, to be not more than the impedance RE/2 with respect to the frequency f1:

$$\frac{C_E R_E - \sqrt{C_E^2 R_E^2 + 8C_E L_E}}{4\pi C_E L_E} \le f_1 \le \frac{C_E R_E + \sqrt{C_E^2 R_E^2 + 8C_E L_E}}{4\pi C_E L_E}. \quad (16)$$

When the above relation is satisfied in the mixer circuit according to the embodiment 8, a high gain is maintained since the negative feedback amount of an emitter differential pair circuit which is formed by the transistors Q23 and Q24 is reduced around the frequency f1, while not only harmonics are reduced but unnecessary low frequency components can be eliminated since the feedback amount is increased in the remaining frequency bands. A similar effect can be attained also when setting of the impedance with respect to the frequency f1 is changed. Thus, the impedance may be properly set in response to the required characteristic.

Embodiment 9

Figure 10:
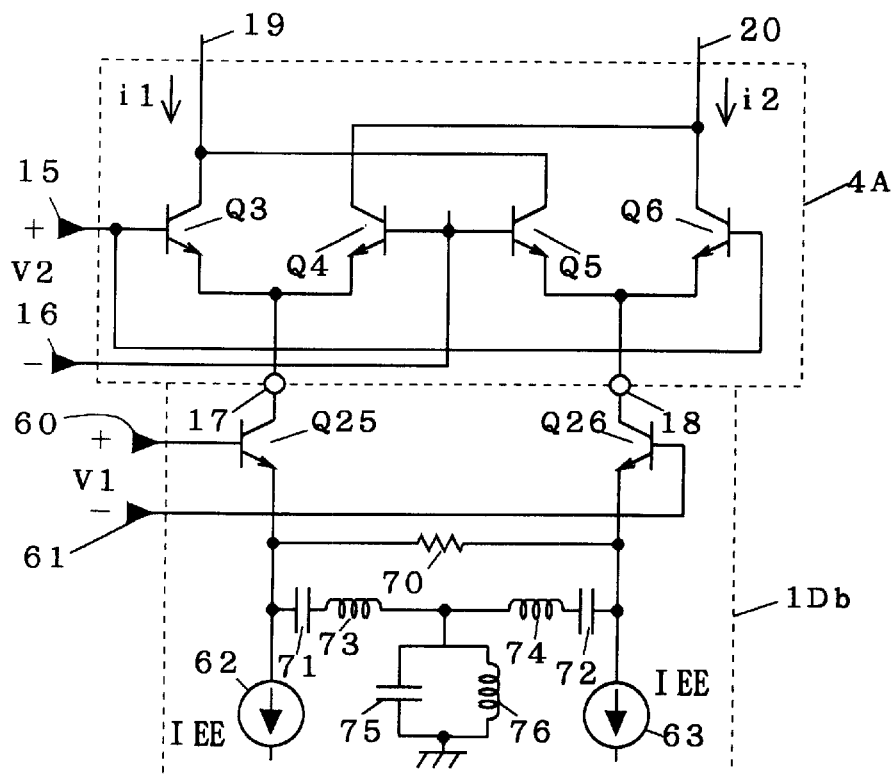
FIG. 10 is a circuit diagram showing the structure of a mixer circuit according to an embodiment 9 of the present invention.

FIG. 10 is a circuit diagram showing the structure of a mixer circuit according to an embodiment 9 of the present invention. Referring to FIG. 10, reference character 1Db denotes a differential amplifier having such a characteristic that the gain with respect to a frequency around a frequency f1 of an input voltage v1 is reduced for amplifying the input voltage v1, and reference character 4A denotes a mixer part for mixing an output of the differential amplifier 1Db with an input voltage v2. The mixer part 4A shown in FIG. 10 corresponds to and has the same structure as the mixer part 4A of FIG. 8. While a resistor 70, capacitive elements 71, 72 and 75 and inductors 73, 74 and 76 are employed in the differential amplifier 1Db shown in FIG. 10 in place of the bandpass filter 64 of the differential amplifier 1D shown in FIG. 8, the remaining parts of the differential amplifiers 1Db and 1D are identical in structure to each other.

The resistor 70 directly connects the emitters of transistors Q25 and Q26 with each other. The capacitive element 71 has a first electrode which is connected to an emitter of the transistor Q25, and a second electrode. The inductor 73 has a first end which is connected to the second electrode of the capacitive element 71, and a second end. The inductor 74 has a first end which is connected to the second end of the inductor 73, and a second end. The capacitive element 72 has first and second electrodes which are connected to an emitter of the transistor Q26 and the second end of the inductor 74 respectively. The inductor 76 and capacitor 75 are connected in parallel between the second end of the inductor 73 and ground.

While the mixer circuit according to the embodiment 9 can not only reduce harmonics but eliminate unnecessary low frequency components similarly to the mixer circuit according to the embodiment 8, the bandpass filter in the embodiment 9 is higher than that in the embodiment 8, and hence the effect of eliminating unnecessary frequency components is improved.

Embodiment 10

Figure 11:
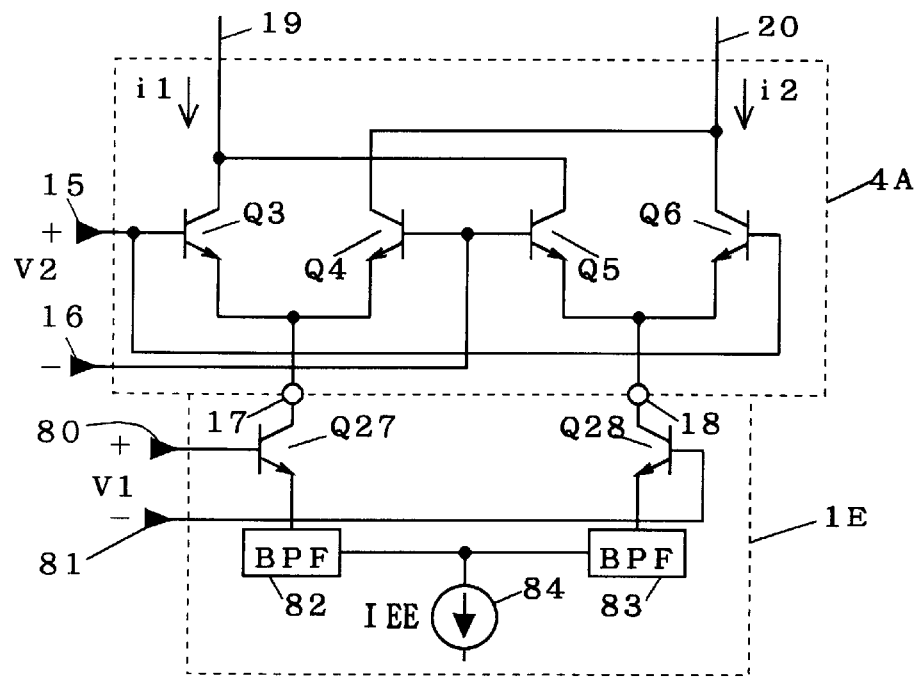
FIG. 11 is a circuit diagram showing the structure of a mixer circuit according to an embodiment 10 of the present invention.

A mixer circuit according to an embodiment 10 of the present invention is now described. FIG. 11 is a circuit diagram showing the structure of the mixer circuit according to the embodiment 10 of the present invention. Referring to FIG. 11, reference character 1E denotes a differential amplifier having a bandpass characteristic for amplifying an input voltage v1, and reference character 4A denotes a mixer part for mixing an output of the differential amplifier 1E with an input voltage v2. The mixer circuit according to the embodiment 10 is formed by the mixer part 4A and the differential amplifier 1E, and outputs first and second output currents i1 and i2 from first and second output terminals respectively.

The differential amplifier 1E is formed by an NPN bipolar transistor Q27 having a base which is connected to a non-inverting input terminal 80 of the differential amplifier 1E and a collector which is connected to a first non-inverting input terminal 17 of the mixer part 4A and an emitter, an NPN bipolar transistor Q28 having a base which is connected to an inverting input terminal 81 of the differential amplifier 1E and a collector which is connected to a first inverting input terminal 18 of the mixer part 4A and an emitter, bandpass filters 82 and 83 which are serially connected between the emitters of the transistors Q27 and Q28, and a current source 84 for extracting a prescribed direct current IEE from a node between the bandpass filters 82 and 83.

The bandpass filters 82 and 83 do not damp signals around the frequencies f1 and f2, and have the same frequency characteristics.

The mixer part 4A shown FIG. 11 corresponds to and has the same structure as the mixer part 4A of FIG. 2.

The emitters of the transistors Q27 and Q28 are connected to the current source 84 through the bandpass filters 82 and 83, whereby a negative feedback effect results in an emitter differential pair circuit which is formed by the transistors Q27 and Q28. The circuits connecting the emitters of the transistors Q27 and Q28 with each other are the bandpass filters 82 and 83, whereby a high gain is maintained by performing proper setting for passing the input signal of the frequency f1 with no damping, while not only harmonics are reduced but unnecessary low frequency components can be eliminated since the feedback amount is increased in the remaining frequency bands, whereby an output of lower distortion can be attained, similarly to the mixer circuit according to the embodiment 7.

Embodiment 11

A mixer circuit according to an embodiment 11 of the present invention is now described. In the embodiment 11, the negative feedback circuit of the amplifier 1 shown in FIG. 1 is not formed to have a low-pass characteristic or a bandpass characteristic dissimilarly to the case of forming the mixer circuit according to the embodiment 1 or 7, but an ordinary amplifier is employed. In the embodiment 11, however, a negative feedback circuit provided in a mixer part 4 has a low-pass characteristic.

Due to the low-pass characteristic of the negative feedback circuit provided in the mixer part 4, the gain with respect to harmonics of an input signal inputted in the mixer part 4 reduced as compared with that for a desired signal, whereby harmonics are hardly generated in the mixer part 4. Thus, harmonic components are reduced in signals mixed in the mixer part 4, whereby an output of lower distortion can be obtained as an output of the mixer circuit.

Figure 12:
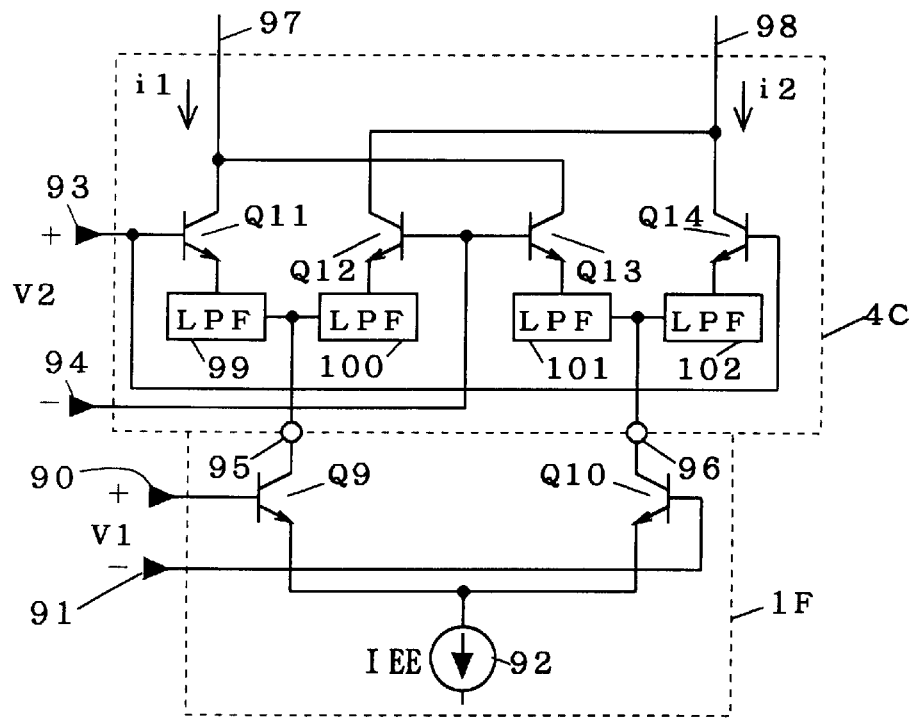
FIG. 12 is a circuit diagram showing the structure of a mixer circuit according to an embodiment 11 of the present invention.

FIG. 12 is a circuit diagram showing the structure of the mixer circuit according to the embodiment 11 of the present invention. Referring to FIG. 12, reference character 1F denotes a differential amplifier for amplifying an input voltage v1, and reference character 4C denotes a mixer part for mixing an output of the differential amplifier 1F with an input voltage v2. The mixer part 4C comprises a negative feedback circuit having a low-pass characteristic. The mixer circuit according to the embodiment 11 is formed by the mixer part 4C and the differential amplifier 1F, and outputs first and second output currents i1 and i2 from first and second output terminals respectively. The first and second input voltages v1 and v2 are signals having different frequencies f1 and f2 respectively.

The differential amplifier 1F is formed by an NPN bipolar transistor Q9 having a base which is connected to a non-inverting input terminal 90 of the differential amplifier 1F and a collector which is connected to a first non-inverting input terminal 95 of the mixer part 4C and an emitter, an NPN bipolar transistor Q10 having a base, which is connected to an inverting input terminal 91 of the differential amplifier 1F, a collection connected to a first inverting input terminal 96 of the mixer part 4C and an emitter connected to the emitter of the transistor Q9 respectively, and a current source 92 for extracting a prescribed direct current IEE from a node between the emitters of the transistors Q9 and Q10.

The mixer part 4C is formed by an NPN bipolar transistor Q11 having a base which is connected to a second non-inverting input terminal 93 and a collector which is connected to a first output terminal 97 and an emitter, an NPN bipolar transistor Q12 having a base which is connected to a second inverting input terminal 94 and a collector which is connected to a second output terminal 98 and an emitter, an NPN bipolar transistor Q13 having a base which is connected to the second inverting input terminal 94 and a collector which is connected to the first output terminal 97 and an emitter, an NPN bipolar transistor Q14 having a base which is connected to the second non-inverting input terminal 93 and a collector which is connected to the second output terminal 98 and an emitter, a low-pass filter 99 which is connected between the emitter of the transistor Q11 and the first non-inverting input terminal 95, a low-pass filter 100 which is connected between the emitter of the transistor Q12 and the first non-inverting input terminal 95, a low-pass filter 101 which is connected between the emitter of the transistor Q13 and the first inverting input terminal 96, and a low-pass filter 102 which is connected between the emitter of the transistor Q14 and the first inverting input terminal 96.

The low-pass filters 99 to 102 have frequency characteristics of not damping the frequencies f1 and f2 of the first and second input voltages v1 and v2.

The inputted first input voltage v1 is amplified by an emitter differential pair circuit which is formed by the transistors Q9 and Q10, and appears as the difference between respective collector currents of the transistors Q9 and Q10. The respective collector currents of the transistors Q9 and Q10 define tail currents of an emitter differential pair circuit which is formed by the transistors Q11 and Q12 and that formed by the transistors Q13 and Q14. The second input voltage v2 is amplified by the emitter differential pair circuits formed by the transistors Q11, Q12, Q13 and Q14.

The emitters of the transistors Q11 and Q12 are connected with each other through the low-pass filters 99 and 100 and the emitters of the transistors Q13 and Q14 are connected with each other through the low-pass filters 101 and 102, whereby a negative feedback effect results in the emitter differential pair circuit which is formed by the transistors Q11 and Q12 through the low-pass filters 99 and 100 while a negative feedback effect results in the emitter differential pair circuit which is formed by the transistors Q13 and Q14 through the low-pass filters 101 and 102.

Further, the low-pass filters 99 and 100 are connected between the emitters of the transistors Q11 and Q12, whereby the feedback amount for a signal having a frequency exceeding the cut-off frequency of the low-pass filters 99 and 100 is increased as the frequency is increased. Namely, the gain of the emitter differential pair circuit, which is formed by the transistors Q11 and Q12, with respect to harmonics generated in this emitter differential pair circuit is smaller than that with respect to a desired signal, whereby harmonics are hardly generated in the emitter differential pair circuit formed by the transistors Q11 and Q12. This also applies to the emitter differential pair circuit which is formed by the transistors Q13 and Q14. Therefore, harmonic components of signals which are mixed in the emitter differential pair circuit formed by the transistors Q11 and Q12 and the transistors Q13 and Q14, such as intermodulation distortion having frequencies of the sum of and the difference between the frequencies f1 and f2 of the input voltages v1 and v2, for example, are reduced, whereby nonlinearity of the mixer circuit is so improved that an output of lower distortion than the conventional mixer circuit shown in FIG. 16 can be obtained.

A negative feedback circuit such as a circuit consisting of the inductor 21 of the embodiment 2, the resistors 22 and 23 and the inductor 24 of the embodiment 3 or the inductors 25 and 26 and the capacitive element 27 of the embodiment 4 may alternatively be inserted in place of the low-pass filters 99 to 102, to attain an effect similar to those of the aforementioned embodiments.

Embodiment 12

Figure 13:
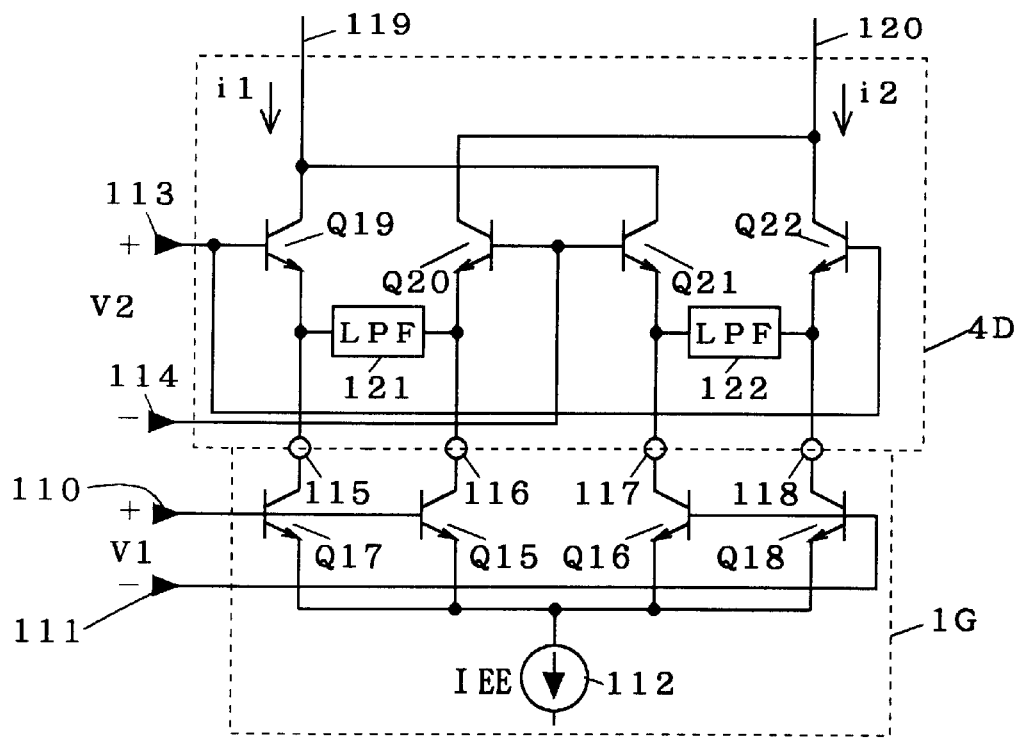
FIG. 13 is a circuit diagram showing the structure of a mixer circuit according to an embodiment 12 of the present invention.

FIG. 13 is a circuit diagram showing the structure of a mixer circuit according to an embodiment 12 of the present invention. Referring to FIG. 13, reference character 1G denotes a differential amplifier for amplifying an input voltage v1, and reference character 4D denotes a mixer part for mixing an output of the differential amplifier 1G with an input voltage v2. The mixer part 4D comprises a negative feedback circuit having a low-pass characteristic. The mixer circuit according to the embodiment 12 is formed by the mixer part 4D and the differential amplifier 1G, and outputs first and second output currents i1 and i2 from first and second output terminals respectively.

The amplifier 1G is formed by an NPN bipolar transistor Q15 having a base which is connected to a non-inverting input terminal 110 of the amplifier 1G and a collector connected to a first non-inverting input terminal 116 and an emitter, an NPN bipolar transistor Q17 having a base, a collector and an emitter which are connected to the non-inverting input terminal 110 of the amplifier 1G, a first non-inverting input terminal 115 of the mixer part 4D and the emitter of the transistor Q15 respectively, an NPN bipolar transistor Q16 having a base, a collector and an emitter which are connected to an inverting input terminal 111, a first inverting input terminal 117 and the emitter of the transistor Q15 respectively, an NPN bipolar transistor Q18 having a base, a collector and an emitter which are connected to the inverting input terminal 111, a first inverting input terminal 118 and the emitter of the transistor Q15 respectively, and a current source 112 for extracting a direct current IEE from a node between the emitters of the transistors Q15 to Q18.

On the other hand, the mixer part 4D is formed by an NPN bipolar transistor Q19 having a base, a collector and an emitter which are connected to a second non-inverting input terminal 113, a first output terminal 119 of the mixer part 4D and the first non-inverting input terminal 115 respectively, an NPN bipolar transistor Q20 having a base, a collector and an emitter which are connected to a second non-inverting input terminal 114, a second output terminal 120 of the mixer part 4D and the first non-inverting input terminal 116 respectively, an NPN bipolar transistor Q21 having a base, a collector and an emitter which are connected to the second inverting input terminal 114, the first output terminal 119 and the first inverting input terminal 117 respectively, an NPN bipolar transistor Q22 having a base, a collector and an emitter which are connected to the second non-inverting input terminal 113, the second output terminal 120 and the first inverting input terminal 118 respectively, a low-pass filter 121 which is connected between the emitters of the transistors Q19 and Q20, and a low-pass filter 122 which is connected between the emitters of the transistors Q21 and Q22.

The emitters of the transistors Q19 and Q20 are connected with each other through the low-pass filter 121 and the emitters of the transistors Q21 and Q22 are connected with each other through the low-pass filter 122, whereby negative feedback effects result in an emitter differential pair circuit which is formed by the transistors Q19 and Q20 through the low-pass filter 121 and in that formed by the transistors Q21 and Q22 through the low-pass filter 122 respectively.

Figure 16:
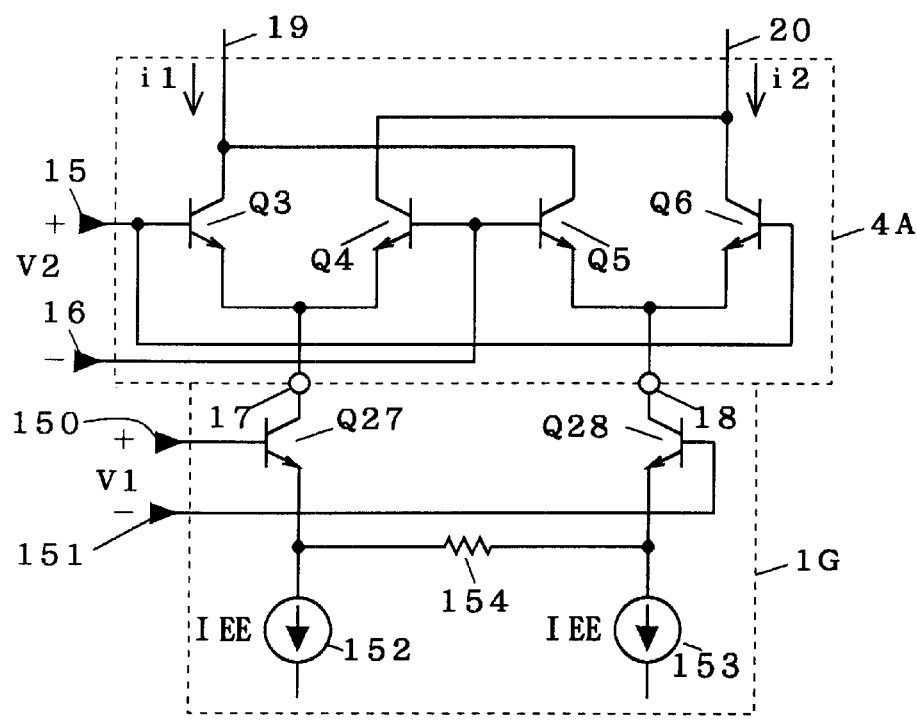
FIG. 16 is a circuit diagram showing the structure of a conventional mixer circuit.

Therefore, harmonic components of signals which are mixed in the emitter differential pair circuit formed by the transistors Q19 and Q20 and the transistors Q21 and Q22 are reduced similarly to the embodiment 11, whereby nonlinearity of the mixer circuit is so improved that an output of lower distortion than the conventional mixer circuit shown in FIG. 16 can be obtained.

A negative feedback circuit such as a circuit consisting of the inductor 21 of the embodiment 2, the resistors 22 and 23 and the inductor 24 of the embodiment 3 or the inductors 25 and 26 and the capacitive element 27 of the embodiment 4 may alternatively be inserted in place of the low-pass filters 121 and 122, to attain an effect similar to those of the aforementioned embodiments.

Embodiment 13

In a mixer circuit according to an embodiment 13, the negative feedback circuit in the mixer part 4 shown in FIG. 1 has a bandpass characteristic. The negative feedback circuit in the mixer part 4 has the characteristic for passing the frequencies of signals inputted from the input terminals 3 and 5, whereby signals in a frequency band other than the band comprising the input signals inputted in the mixer part 4 are reduced. Therefore, unnecessary frequency components other than a desired frequency are hardly generated in the mixer part 4. Such unnecessary frequency components include intermodulation distortion, for example. In other words, the mixer part 4 is so formed as to have a frequency characteristic capable of damping such unnecessary frequency components. The unnecessary frequency components in the signals mixed in the mixer part 4 are reduced, whereby an output of lower distortion can be obtained in the mixer circuit as compared with the cases of eliminating only high frequencies.

Figure 14:
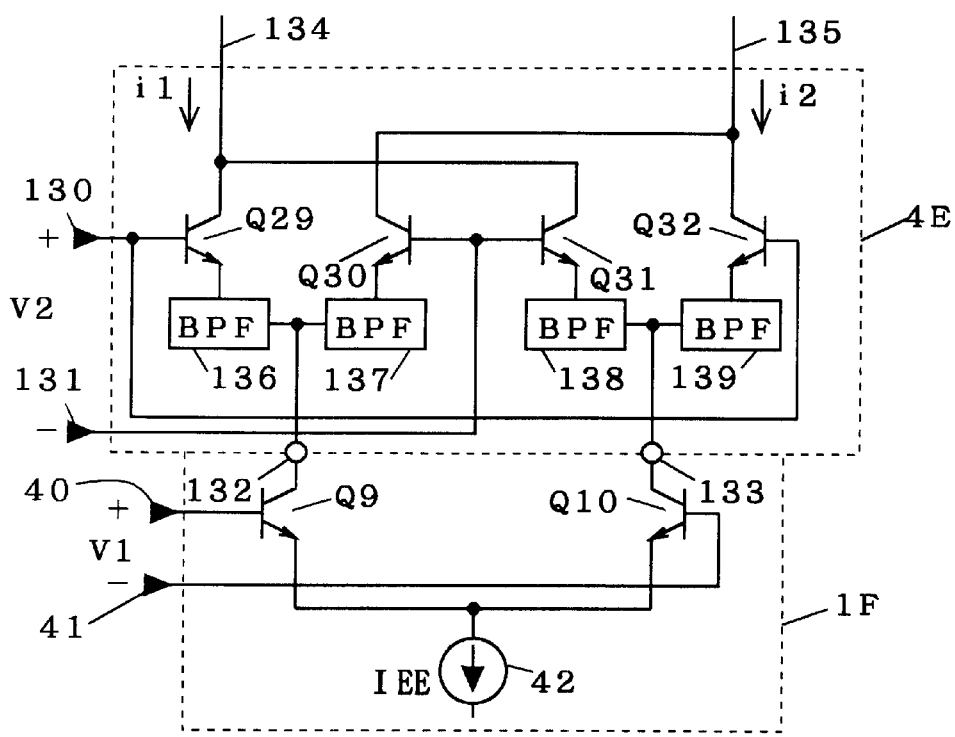
FIG. 14 is a circuit diagram showing the structure of a mixer circuit according to an embodiment 13 of the present invention.

FIG. 14 is a circuit diagram showing the structure of the mixer circuit according to the embodiment 13 of the present invention. Referring to FIG. 14, reference character 1F denotes a differential amplifier for amplifying an input voltage v1, and reference character 4E denotes a mixer part for mixing an output of the differential amplifier 1F with an input voltage v2. The mixer circuit according to the embodiment 13 is formed by the mixer part 4E and the differential amplifier 1F, and outputs first and second output currents i1 and i2.

The amplifier 1F shown in FIG. 14 corresponds to and has the same structure as the amplifier 1F of FIG. 12.

The mixer part 4E is formed by an NPN bipolar transistor Q29 having a base which is connected to a second non-inverting input terminal 130 of the mixer part 4E and a collector which is connected to a first output terminal 134 of the mixer part 4E and an emitter, an NPN bipolar transistor Q30 having a base which is connected to a second inverting input terminal 131 of the mixer part 4E and a collector which is connected to a second output terminal 135 and an emitter, an NPN bipolar transistor Q31 having a base which is connected to a second inverting input terminal 131 and a collector which is connected to the first output terminal 134 and an emitter, an NPN bipolar transistor Q32 having a base which is connected to the second non-inverting input terminal 130 and a collector which is connected to the second output terminal 135 and an emitter, a bandpass filter 136 which is connected between the emitter of the transistor Q29 and a first non-inverting input terminal 132, a bandpass filter 137 which is connected between the emitter of transistor Q30 and the first non-inverting input terminal 132, a bandpass filter 138 which is connected between the emitter of the transistor Q31 and a first inverting input terminal 133, and a bandpass filter 139 which is connected between the emitter of the transistor Q32 and the first inverting input terminal 133.

The bandpass filters 136, 137, 138, and 139 have frequency characteristics for passing signals in a frequency band around frequencies f1 and f2 as such and not damping signals of the frequencies f1 and f2.

The emitters of the transistors Q29 and Q30 are connected with each other through the bandpass filters 136 and 137, whereby a negative feedback effect results in an emitter differential pair circuit which is formed by the transistors Q29 and Q30. Further, emitter common elements of the transistors Q31 and Q32 are the bandpass filters 138 and 139, whereby the feedback amount is larger except the pass frequency of the bandpass filters 138 and 139. Namely, the gain of an emitter differential pair circuit which is formed by the transistors Q29 and Q30 with respect to harmonics generated in this emitter differential pair circuit is smaller than that with respect to a desired signal, whereby unnecessary frequency components are hardly caused in the emitter differential pair circuit formed by the transistors Q29 and Q30. Therefore, unnecessary frequency components of signals which are mixed in the mixer part 4E comprising the transistors Q29 and Q30 are reduced, whereby an output of lower distortion than the conventional mixer circuit can be obtained.

Embodiment 14

Figure 15:
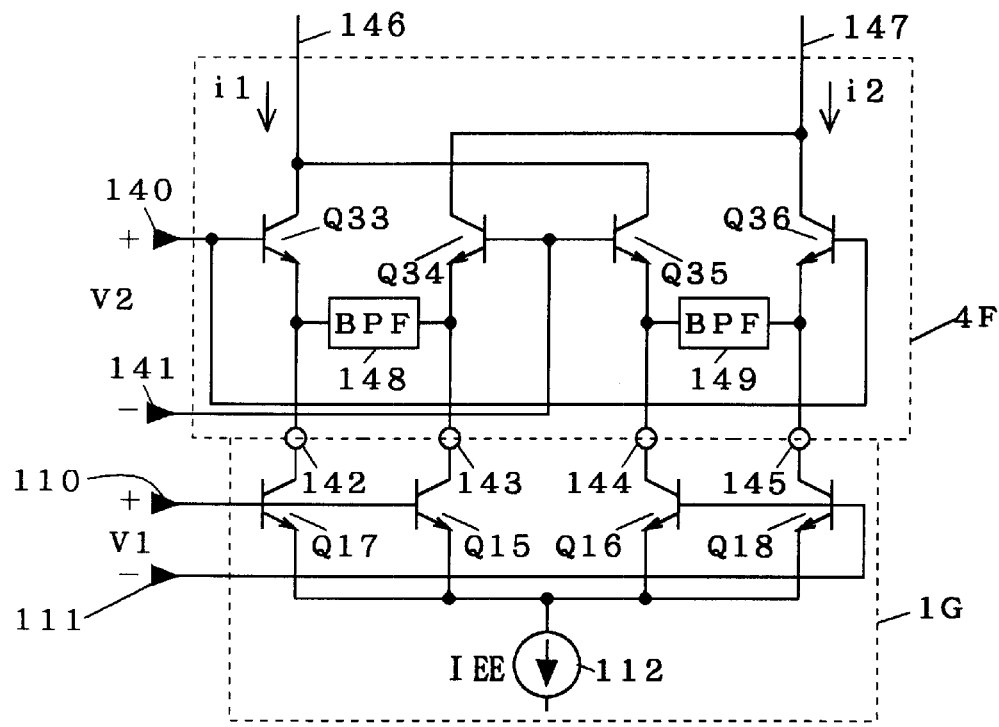
FIG. 15 is a circuit diagram showing the structure of a mixer circuit according to an embodiment 14 of the present invention.

FIG. 15 is a circuit diagram showing the structure of a mixer circuit according to an embodiment 14 of the present invention. Reference character 1G denotes a differential amplifier for amplifying an input voltage v1, and reference character 4F denotes a mixer part for mixing an output of the differential amplifier 1G with an input voltage v2. The mixer part 4F comprises a negative feedback circuit having a bandpass characteristic. The mixer circuit according to the embodiment 14 is formed by the mixer part 4F and the differential amplifier 1G, and outputs first and second output currents i1 and i2.

The amplifier 1G is formed by an NPN bipolar transistor Q15 having a base which is connected to a non-inverting input terminal 110 of the amplifier 1G and a collector which is connected to a first non-inverting input terminal 143 of the mixer part 4F and an emitter, an NPN bipolar transistor Q17 having a base, which is connected to the non-inverting input terminal 110 and a collector connector to a first non-inverting input terminal 142 and an emitter connected to the emitter of the transistor Q15 respectively, an NPN bipolar transistor Q16 having a base, which is connected to an inverting input terminal 111 of the amplifier 1G and a collector connected to a first inverting input terminal 144 and an emitter connected to the emitter of the transistor Q 15 respectively, an NPN bipolar transistor Q18 having a base which is connected to the inverting input terminal 111 and a collector connected to a first inverting input terminal 145 and an emitter connected to the emitter of the transistor Q15 respectively, and a current source 112 for extracting a direct current IEE from a node between the emitters of the transistors Q15 to Q18.

The mixer part 4F is formed by an NPN bipolar transistor Q33 having a base, a collector and an emitter which are connected to a second non-inverting input terminal 140, a first output terminal 146 of the mixer part 4F and a first non-inverting input terminal 142 respectively, an NPN bipolar transistor Q34 having a base, a collector and an emitter which are connected to a second inverting input terminal 141, a second output terminal 147 of the mixer part 4F and a first non-inverting input terminal 143 respectively, an NPN bipolar transistor Q35 having a base, a collector and an emitter which are connected to the second inverting input terminal 141, the first output terminal 146 and the first inverting input terminal 144 respectively, an NPN bipolar transistor Q36 having a base, a collector and an emitter which are connected to the second non-inverting input terminal 140, the second output terminal 147 and the first inverting input terminal 145 respectively, a low-pass filter 148 which is connected between the emitters of the transistors Q33 and Q34, and a low-pass filter 149 which is connected between the emitters of the transistors Q35 and Q36.

The emitters of the transistors Q33 and Q34 are connected with each other through the bandpass filter 148 and the emitters of the transistors Q35 and Q36 are connected with each other through the bandpass filter 149 respectively, whereby negative feedback effects result in an emitter differential pair circuit which is formed by the transistors Q33 and Q34 through the bandpass filter 148 and that formed by the transistors Q35 and Q36 through the bandpass filter 149 respectively.

Therefore, unnecessary frequency components of signals which are mixed in the emitter differential pair circuit formed by the transistors Q33 and Q34 and the transistors Q35 and Q36 are reduced similarly to the embodiment 13, whereby an output of lower distortion than the conventional mixer circuit can be obtained.

A negative feedback circuit such as a circuit consisting of the resistor 65, the capacitive elements 66 and 67 and the inductor 68 of the embodiment 8 or the resistor 70, the inductors 73, 74 and 76 and the capacitive elements 71, 72 and 75 of the embodiment 9 may alternatively be inserted in place of the bandpass filters 148 and 149, to attain an effect similar to those of the aforementioned embodiments.

While the invention has been shown and described in detail, the foregoing description is in all aspects illustrative and not restrictive. It is therefore understood that numerous modifications and variations can be devised without departing from the scope of the invention.

We claim:
1. A mixer circuit comprising:
 a mixer part for mixing first and second signals received from first and second input terminals and comprising an output terminal for outputting a signal; and an amplifier comprising:
an input terminal for receiving a signal to be amplified;
an output terminal connected to the first input terminal of said mixer part;
a first transistor connected to said amplifier input and output terminals and having a first control electrode, a first current electrode and a second current electrode;
a second transistor connected to said amplifier input and output terminals and having a second control electrode, a third current electrode and a fourth current electrode; and
a low pass filter connected to the second and fourth current electrodes for reducing harmonics associated with a signal amplified by said first and second transistors.

2. The mixer circuit of claim 1 wherein said first control electrode is connected to a non-inverting input voltage terminal and said second control electrode is connected to an inverting input voltage terminal.

3. The mixer circuit of claim 1 wherein said low pass filter is formed by a single inductor.

4. The mixer circuit of claim 1 wherein said low pass filter comprises a first resistor connected in series to an inductor which is connected in series to a second resistor.

5. The mixer circuit of claim 1 wherein said low pass filter is a high order low pass filter which is formed from two inductors and a capacitive element.

6. The mixer circuit of claim 5 wherein said inductors are serially connected between said second and fourth control electrodes and said capacitive element is connected across a node between the inductors and a ground potential point.

7. The mixer circuit of claim 1 wherein said first and second transistors are NPN transistors.

8. The mixer circuit of claim 1 wherein said first and second transistors are MOSFETs.

9. A mixer circuit comprising:
a mixer part for mixing first and second signals received from first and second input terminals and comprising an output terminal for outputting a signal; and
an amplifier comprising:
an input terminal for receiving a signal to be amplified;
an output terminal connected to the first input terminal of said mixer part;
a first transistor connected to said amplifier input and output terminals and having a first control electrode, a first current electrode and a second current electrode;
a second transistor connected to said amplifier input and output terminals and having a second control electrode, a third current electrode and a fourth current electrode;
a first low pass filter connected in series between said second current electrode and a current source; and
a second low pass filter connected in series between said fourth current electrode and a second current source.

10. The mixer circuit of claim 9 wherein said first control electrode is connected to a non-inverting input voltage terminal and said second control electrode is connected to an inverting input voltage terminal.

11. The mixer circuit of claim 9 wherein each low pass filter is, formed by a single inductor.

12. The mixer circuit of claim 9 wherein each low pass filter is formed by a first resistor connected in series to an inductor which is connected in series to a second resistor.

13. The mixer circuit of claim 9 wherein each of said low pass filters is a high order low pass filter which is formed from two inductors and a capacitive element.

14. The mixer circuit of claim 13 wherein said inductors are serially connected between respective second and fourth current electrodes and current sources and said capacitive element is connected across a node between the inductors and a ground potential point.

15. The mixer circuit of claim 9 wherein said first low pass filter is formed by one of a single inductor, a series connection of a first resistor, an inductor and a second resistor, or two inductors and a capacitive element and said second low pass filter is formed by one of a single inductor, a series connection of a first resistor, an inductor and a second resistor, or two inductors and a capacitive element.

16. A mixer circuit comprising:
a mixer part for mixing first and second signals received from first and second input terminals and comprising an output terminal for outputting a signal; and
an amplifier comprising:
an input terminal for receiving a signal to be amplified;
an output terminal connected to the first input terminal of said mixer part;
a first transistor connected to said amplifier input and output terminals and having a first control electrode, a first current electrode and a second current electrode;
a second transistor connected to said amplifier input and output terminals and having a second control electrode, a third current electrode and a fourth current electrode; and
a bandpass filter connected to the second current electrode and the fourth current electrode which aids in reducing harmonics and eliminating unnecessary low frequency components associated with the signal amplified by the first and second transistors.

17. The mixer circuit of claim 16 wherein said bandpass filter is formed by a parallel connection of a resistor and a series connection of a first capacitive element connected to an inductor which is connected to a second capacitive element.

18. The mixer circuit of claim 16 wherein said bandpass filter is formed by a parallel connection of a resistor and a series connection of a first capacitive element connected to a first inductive element which is connected through a second inductive element to a second capacitive element and having a third inductive element and a third capacitive element connected in parallel to a node between the first and second inductive elements and ground.

19. The mixer circuit of claim 16 wherein said bandpass filter is a high order bandpass filter.

20. A mixer circuit comprising:
a mixer part for mixing first and second signals received from first and second input terminals and comprising an output terminal for outputting a signal; and
an amplifier comprising:
an input terminal for receiving a signal to be amplified;
an output terminal connected to the first input terminal of said mixer part;
a first transistor connected to said amplifier input and output terminals and having a first control electrode, a first current electrode and a second current electrode;
a second transistor connected to said amplifier input and output terminals and having a second control electrode, a third current electrode and a fourth current electrode;
a first bandpass filter connected in series between said second current electrode and a current source; and
a second bandpass filter connected in series between said fourth current electrode and a second current source;

wherein said bandpass filters reduce harmonics and eliminate unnecessary low frequency components associated with the signal amplified by said first and second transistors.

21. The mixer circuit of claim 20 wherein said bandpass filters are high order bandpass filters.

22. A mixer circuit comprising:
a mixer part for mixing first and second signals received from first and second input terminals and comprising an output terminal for outputting a signal, said mixer part further comprising:
a first transistor connected to said first and second input terminals and said output terminal and having a first control electrode, a first current electrode and a second current electrode;
a second transistor connected to said first and second input terminals and said output terminal and having a second control electrode, a third current electrode and a fourth current electrode;
a third transistor connected to said first and second input terminals and said output terminal and having a third control electrode, a fifth current electrode and a sixth current electrode;
a fourth transistor connected to said first and second input terminals and said output terminal and having a fourth control electrode, a seventh current electrode and an eighth current electrode; and
at least two low pass filters at least one of which is connected to the sixth and eighth current electrodes;
an amplifier comprising:
an input terminal for receiving a signal to be amplified; and
an output terminal connected to the first input terminal of said mixer part;
wherein said low pass filters reduce harmonics associated with the signal mixed by said transistors.

23. The mixer circuit of claim 22 wherein each low pass filter is formed by a single inductor.

24. The mixer circuit of claim 22 wherein each low pass filter is formed by a first resistor connected in series to an inductor which is connected in series to a second resistor.

25. The mixer circuit of claim 22 wherein each of said low pass filters is a high order low pass filter which is formed from two inductors and a capacitive element.

26. The mixer circuit of claim 25
wherein said two inductors of a first high order low pass filter are serially connected between respective second and fourth current electrodes and said two inductors of a second high order low pass filter are serially connected between respective sixth and eighth current electrodes and
wherein said capacitive element of each high order low pass filter is connected across a node between the serially connected inductors and a ground potential point.

27. The mixer circuit of claim 22 wherein a first of said at least two low pass filters is formed by one of a single inductor, a series connection of a first resistor, an inductor and a second resistor, or two inductors and a capacitive element and a second of said at least two low pass filters is formed by one of a single inductor, a series connection of a first resistor, an inductor and a second resistor, or two inductors and a capacitive element.

28. The mixer circuit of claim 22 wherein a first of said at least two low pass filters is connected between the second and fourth current electrodes and a second of said at least two low pass filters is connected between the sixth and eighth current electrodes.

29. The mixer circuit of claim 28 wherein the first low pass filter is formed by one of a single inductor, a series connection of a first resistor, an inductor and a second resistor, or two inductors and a capacitive element and the second low pass filter is formed by one of a single inductor, a series connection of a first resistor, an inductor and a second resistor, or two inductors and a capacitive element.

30. The mixer circuit of claim 22 wherein a first and a second of said at least two low pass filters are connected between the second and fourth current electrodes and a third and a fourth of said at least two low pass filters are connected between the sixth and eighth current electrodes.

31. The mixer circuit of claim 30 wherein each of the first, second, third and fourth low pass filters is formed by one of a single inductor, a series connection of a first resistor, an inductor and a second resistor, or two inductors and a capacitive element.

32. A mixer circuit comprising:
a mixer part for mixing first and second signals received from first and second input terminals and comprising an output terminal for outputting a signal, said mixer part further comprising:
a first transistor connected to said first and second input terminals and said output terminal and having a first control electrode, a first current electrode and a second current electrode;
a second transistor connected to said first and second input terminals and said output terminal and having a second control electrode, a third current electrode and a fourth current electrode;
a third transistor connected to said first and second input terminals and said output terminal and having a third control electrode, a fifth current electrode and a sixth current electrode;
a fourth transistor connected to said first and second input terminals and said output terminal and having a fourth control electrode, a seventh current electrode and an eighth current electrode; and
at least two bandpass filters, at least one of which is connected to the sixth and eighth current electrodes;
an amplifier comprising:
an input terminal for receiving a signal to be amplified; and
an output terminal connected to the first input terminal of said mixer part;
wherein said bandpass filters reduce both harmonics and unnecessary frequency components associated with the signal mixed by said transistors.

33. The mixer circuit of claim 32 wherein a first of said at least two bandpass filters is connected between the second and fourth current electrodes and a second of said at least two bandpass filters is connected between the sixth and eighth current electrodes.

34. The mixer circuit of claim 32 wherein a first and a second of said at least two bandpass filters are connected between the second and fourth current electrodes and a third and a fourth of said at least two bandpass filters are connected between the sixth and eighth current electrodes.

35. The mixer circuit of claim 32 wherein said transistors are NPN transistors.

36. The mixer circuit of claim 32 wherein said bandpass filters are high order bandpass filters.

* * * * *